US012144191B2

(12) United States Patent
Khodagholy et al.

(10) Patent No.: US 12,144,191 B2
(45) Date of Patent: Nov. 12, 2024

(54) INTERNAL-ION GATED ELECTROCHEMICAL TRANSISTORS

(71) Applicant: The Trustees of Columbia University in the City of New York, New York, NY (US)

(72) Inventors: Dion Khodagholy, New York, NY (US); Georgios Spyropoulos, New York, NY (US)

(73) Assignee: The Trustees of Columbia University in the City New York, New York, NY (US)

( * ) Notice: Subject to any disclaimer, the term of this patent is extended or adjusted under 35 U.S.C. 154(b) by 425 days.

(21) Appl. No.: 17/352,622

(22) Filed: Jun. 21, 2021

(65) Prior Publication Data
US 2021/0313529 A1   Oct. 7, 2021

Related U.S. Application Data

(63) Continuation of application No. PCT/US2019/068363, filed on Dec. 23, 2019.
(Continued)

(51) Int. Cl.
*H10K 10/46* (2023.01)
*G01N 27/414* (2006.01)
*H10K 77/10* (2023.01)

(52) U.S. Cl.
CPC ........... *H10K 10/46* (2023.02); *G01N 27/414* (2013.01); *H10K 77/111* (2023.02)

(58) Field of Classification Search
CPC .... H10K 10/481; H10K 10/46; H10K 77/111; G02F 2001/1635; G01N 27/414; G01N 27/00; G01N 27/4145
See application file for complete search history.

(56) References Cited

U.S. PATENT DOCUMENTS

| 5,200,051 A | 4/1993 | Cozzette et al. |
| 6,577,893 B1 | 6/2003 | Besson et al. |

(Continued)

FOREIGN PATENT DOCUMENTS

| CN | 106770515 | 5/2017 |
| KR | 101713240 | 3/2017 |

(Continued)

OTHER PUBLICATIONS

Berggren, M., et al., "Organic Materials for Printed Electronics", in Nature Materials, vol. 6, Jan. 1, 2007, pp. 1-3.
(Continued)

*Primary Examiner* — Ratisha Mehta
(74) *Attorney, Agent, or Firm* — Byrne Poh LLP

(57) ABSTRACT

An internal-ion gated electrochemical transistor is provided. In some embodiments, the internal-ion gated electrochemical transistor comprises: a gate electrode, a source electrode, and a drain electrode; a channel formed between the source electrode and the drain electrode, wherein the channel comprises a conducting polymer, wherein the channel serves as a reservoir of positively charged mobile ions; and an ion membrane between the channel and the gate electrode, wherein: in an off state, at least a subset of the positively charged mobile ions are ionically bonded to negatively charged ions of the conducting polymer, and wherein in an on state, at least a subset of the positively charged mobile ions are unbonded from the negatively charged ions of the conducting polymer to induce a current within the channel, and wherein at least one of the off state and the on state is actuated by application of a voltage to the gate electrode.

10 Claims, 18 Drawing Sheets

Related U.S. Application Data

(60) Provisional application No. 62/952,692, filed on Dec. 23, 2019, provisional application No. 62/784,315, filed on Dec. 21, 2018.

(56) References Cited

U.S. PATENT DOCUMENTS

| | | | |
|---|---|---|---|
| 7,357,810 B2 | 4/2008 | Koyfman et al. | |
| 7,952,090 B2* | 5/2011 | Kugler | G02F 1/163 |
| | | | 257/E29.1 |
| 7,967,839 B2 | 6/2011 | Flock et al. | |
| 8,137,524 B2 | 3/2012 | Berggren et al. | |
| 8,398,680 B2 | 3/2013 | Sauer et al. | |
| 8,777,988 B2 | 7/2014 | Leung et al. | |
| 9,178,170 B2* | 11/2015 | Yan | G01N 27/4145 |
| 9,201,039 B2* | 12/2015 | Hanko | G01N 27/3335 |
| 2008/0283833 A1* | 11/2008 | Kim | H01L 27/12 |
| | | | 257/E27.06 |
| 2009/0163951 A1 | 6/2009 | Simmons et al. | |
| 2009/0286097 A1* | 11/2009 | Yang | C09J 11/06 |
| | | | 156/60 |
| 2009/0321721 A1* | 12/2009 | Malenfant | B82Y 10/00 |
| | | | 257/E27.111 |
| 2010/0032661 A1* | 2/2010 | Osterbacka | H10K 10/464 |
| | | | 257/E51.024 |
| 2015/0115227 A1 | 4/2015 | Yan et al. | |
| 2017/0174872 A1 | 6/2017 | Zhang et al. | |
| 2018/0226256 A1* | 8/2018 | Li | H01L 29/66742 |
| 2018/0362342 A1* | 12/2018 | Wu | C30B 7/105 |

FOREIGN PATENT DOCUMENTS

| | | |
|---|---|---|
| WO | WO 2003046540 | 11/2002 |
| WO | WO 2005037098 | 10/2004 |

OTHER PUBLICATIONS

Bernards, D.A. and Malliaras, G.G., "Steady-State and Transient Behavior of Organic Electrochemical Transistors", in Advanced Functional Materials, vol. 17, No. 17, Nov. 2007, pp. 3538-3544.

Bolin, M.H., et al., "Active Control of Epithelial Cell-Density Gradients Grown Along the Channel of an Organic Electrochemical Transistor", in Advanced Materials, vol. 21, No. 43, Nov. 20, 2009, pp. 4379-4382.

Canolty, R.T., et al., "High Gamma Power is Phase-Locked to Theta Oscillations in Human Neocortex", in Science, vol. 313, No. 5793, Sep. 15, 2006, pp. 1626-1628.

Cheng, J.C., et al., "Lithographic Patterning of Immobilized Enzymes in Chitosan Thin Films for Multi-layer, Chemical/Biological Sensors", in Proceedings of the 7th IEEE Conference on Nanotechnology (IEEE NANO), Hong Kong, CN, Aug. 2-5, 2007, pp. 334-337.

Cho, J.H., et al., "High-Capacitance Ion Gel Gate Dielectrics with Faster Polarization Response Times for Organic Thin Film Transistors", in Advanced Materials, vol. 20, No. 4, Feb. 2008, pp. 686-690.

Crone, B., et al., "Large-Scale Complementary Integrated Circuits Based on Organic Transistors", in Nature, vol. 403, Feb. 3, 2000, pp. 521-523.

Deisseroth, K., "Optogenetics: 10 Years of Microbial Opsins in Neuroscience", in Nature Neuroscience, vol. 18, Aug. 26, 2015, pp. 1213-1225.

Dimitrakopoulos, C.D. and Malenfant, P.R.L., "Organic Thin Film Transistors for Large Area Electronics", in Advanced Materials, vol. 14, No. 2, Jan. 17, 2002, pp. 99-117.

Ersman, P.A., et al., "Screen Printed Digital Circuits Based on Vertical Organic Electrochemical Transistors", in Flexible and Printed Electronics, vol. 2, No. 4, Nov. 3, 2017, pp. 1-13.

Facchetti, A., "Gels Excel", in Nature Materials, vol. 7, Nov. 2008, pp. 839-840.

Fang, H., et al., "Ultrathin, Transferred Layers of Thermally Grown Silicon Dioxide as Biofluid Barriers for Biointegrated Flexible Electronic Systems", in Proc. Natl. Acad. Sci. U.S.A., vol. 113, No. 42, Oct. 17, 2016, pp. 11682-11687.

Gkoupidenis, P., et al., "Neuromorphic Device Architectures with Global Connectivity Through Electrolyte Gating", in Nature Communications, vol. 8, May 17, 2017, pp. 1-8.

Ha, M., et al., "Printed, Sub-3V Digital Circuits on Plastic from Aqueous Carbon Nanotube Inks", in ACS Nano, vol. 4, No. 8, Jun. 2010, pp. 4388-4395.

Hamedi, M., et al., "Fiber-Embedded Electrolyte-Gated Field-Effect Transistors for e-Textiles", in Advanced Materials, vol. 21, No. 5, Feb. 2, 2009, pp. 573-577.

International Preliminary Report on Patentability dated Jul. 1, 2021 in International Patent Application No. PCT/US2019/068363, pp. 1-8.

International Search Report and Written Opinion dated Mar. 25, 2020 in International Patent Application No. PCT/US2019/068363, pp. 1-160.

Jimison, L.H., et al., "Measurement of Barrier Tissue Integrity with an Organic Electrochemical Transistor", in Advanced Materials, vol. 24, No. 44, Nov. 20, 2012, pp. 5919-5923.

Jun, J.J., et al., "Fully Integrated Silicon Probes for High-Density Recording of Neural Activity", in Nature, vol. 551, Nov. 9, 2017, pp. 232-236.

Kappenman, E.S. and Luck, S.J., "The Effects of Electrode Impedance on Data Quality and Statistical Significance in ERP Recordings", in Psychophysiology, vol. 47, No. 5, Sep. 2010, pp. 888-904.

Khodagholy, D., et al., "High Speed and High Density Organic Electrochemical Transistor Arrays", in Appl. Phys. Lett., vol. 99, No. 16, Oct. 17, 2011, pp. 1-4.

Khodagholy, D., et al., "High Transconductance Organic Electrochemical Transistors", in Nature Communications, vol. 4, Jul. 12, 2013, pp. 1-6.

Khodagholy, D., et al., "In Vivo Recordings of Brain Activity Using Organic Transistors", in Nature Communications, vol. 4, Mar. 12, 2013, pp. 1-7.

Khodagholy, D., et al., "Learning-Enhanced Coupling Between Ripple Oscillations in Association Cortices and Hippocampus", in Science, vol. 358, No. 6361, Oct. 20, 2017, pp. 369-372.

Kim, D.H., et al., "Stretchable and Foldable Silicon Integrated Circuits", in Science, vol. 320, No. 5875, Apr. 25, 2008, pp. 507-511.

Knopfmacher, O., et al., "Highly Stable Organic Polymer Field-Effect Transistor Sensor for Selective Detection in the Marine Environment", in Nature Communications, vol. 5, Jan. 6, 2014, pp. 1-9.

Krook-Magnuson, E., et al., "Neuroelectronics and Biooptics: Closed-Loop Technologies in Neurological Disorders", in JAMA Neurol, vol. 72, No. 7, Jul. 2015, pp. 823-829.

Nardes, A.M., et al., "A Morphological Model for the Solvent-Enhanced Conductivity of PEDOT:PSS Thin Films", in Advanced Functional Materials, vol. 18, No. 6, Mar. 26, 2008, pp. 865-871.

Ono, S., et al., "A Comparative Study of Organic Single-Crystal Transistors Gated with Various Ionic-Liquid Electrolytes", in Appl. Phys. Lett., vol. 94, No. 6, Jan. 2009, pp. 1-5.

Panzer, M.J., et al., "Low-Voltage Operation of a Pentacene Field-Effect Transistor with a Polymer Electrolyte Gate Dielectric", in Appl. Phys. Lett., vol. 86, No. 10, Jan. 2005, pp. 1-3.

Ravi Kumar, M.N.V., "A Review of Chitin and Chitosan Applications", in Reactive and Functional Polymers, vol. 46, No. 1, Nov. 2000, pp. 1-27.

Rivnay, J., et al., "Organic Electrochemical Transistors", in Nature Reviews Materials, vol. 3, Jan. 16, 2018, pp. 1-41.

Rivnay, J., et al., "Structural Control of Mixed Ionic and Electronic Transport in Conducting Polymers", in Nature Communications, vol. 7, Apr. 19, 2016, pp. 1-9.

Rogers, J.A., et al., "Materials and Mechanics for Stretchable Electronics", in Science, vol. 327, No. 5973, Mar. 26, 2010, pp. 1603-1607.

Said, E., et al., "Effects of the Ionic Currents in Electrolyte-gated Organic Field-Effect Transistors", in Advanced Functional Materials, vol. 18, No. 21, Nov. 10, 2008, pp. 3529-3536.

(56) References Cited

OTHER PUBLICATIONS

Sheliakina, M., et al., "An All-Solid-State Biocompatible Ion-to-Electron Transducer for Bioelectronics", in Materials Horizons, vol. 5, Jan. 17, 2018, pp. 256-263.

Shimotani, H., et al., "Electrolyte-Gated Charge Accumulation in Organic Single Crystals", in Appl. Phys. Lett., vol. 89, No. 20, Sep. 2006, pp. 1-4.

Someya, T., et al., "A Large-Area, Flexible Pressure Sensor Matrix with Organic Field-Effect Transistors for Artificial Skin Applications", in Proc. Natl. Acad. Sci. U.S.A., vol. 101, No. 27, Jul. 6, 2004, pp. 9966-9970.

Spyropoulos, G.D., et al., "Organic and Perovskite Solar Modules Innovated by Adhesive Top Electrode and Depth-Resolved Laser Patterning", in Energy & Environmental Sciences, vol. 9, No. 7, Jul. 1, 2016, pp. 2302-2313.

Stavrinidou, E., et al., "Electronic Plants", in Science Advances, vol. 1, No. 10, Nov. 20, 2015, pp. 1-9.

Takashima, W., et al., "Electroplasticity Memory Devices Using Conducting Polymers and Solid Polymer Electrolytes", in Polymer International, vol. 27, No. 3, Jan. 1, 1992, pp. 249-253.

Tsumura, A., et al., "Macromolecular Electronic Device: Field-Effect Transistor with a Polythiophene Thin Film", in Appl. Phys. Lett., vol. 49, Nov. 1986, pp. 1210-1212.

Tybrandt, K., et al., "Logic Gates Based on Ion Transistors", in Nature Communications, vol. 3, May 29, 2012, pp. 871-876.

van de Burgt, Y., et al., "A Non-Volatile Organic Electrochemical Device as a Low-Voltage Artificial Synapse for Neuromorphic Computing", In Nature Materials, vol. 16, Feb. 20, 2018, pp. 414-418.

van der Pol, T., "Controlling the Doping Level in a Conducting Polymer for Application in Enhancement Mode Organic Electrochemical Transistors", Technical Report, Eindhoven University of Technology, Feb. 2018, pp. 1-72.

Venkatraman, V., et al., "Subthreshold Operation of Organic Electrochemical Transistors for Biosignal Amplification", in Advanced Science, vol. 5, Jul. 4, 2018, pp. 1-7.

Voelker, M. and Fromherz, P., "Signal Transmission from Individual Mammalian Nerve Cell to Field-Effect Transistor", in Small, vol. 1, No. 2, Feb. 2005, pp. 206-210.

Voroslakos, M., et al., "Direct Effects of Transcranial Electric Stimulation on Brain Circuits in Rats and Humans", in Nature Communications, vol. 9, Feb. 2, 2018, pp. 1-17.

White, H.S., et al., "Chemical Derivatization of an Array of Three Gold Microelectrodes with Polypyrrole: Fabrication of a Molecule-based Transistor", in Journal of the American Chemical Society, vol. 106, No. 18, Sep. 1, 1984, pp. 5375-5377.

Yang, S.Y., et al., "Integration of a Surface-Directed Microfluidic System with an Organic Electrochemical Transistor Array for Multi-Analyte Biosensors", in Lab on a Chip, vol. 9, No. 5, Mar. 7, 2009, pp. 704-708.

Zhang, S., et al., "Solvent-Induced Changes in PEDOT:PSS Films for Organic Electrochemical Transistors", in APL Materials, vol. 3, Dec. 30, 2014, pp. 1-8.

Abidian, M.R., et al., "Conducting-Polymer Nanotubes Improve Electrical Properties, Mechanical Adhesion, Neural Attachment, and Neurite Outgrowth of Neural Electrodes", in Small, vol. 6, No. 3, Jan. 2010, pp. 421-429.

Adair, E. R., et al., "Biological Effects of Radiofrequency/ Microwave Radiation", in IEEE Transactions Microwave Theory Technology, vol. 50, Mar. 2002, pp. 953-962.

Adam, C., "Fibrin Sutures for Non-Scarring Wound Closure", Vitathreads, LLC, NIH Grant R43GM112344, last accessed Nov. 13, 2023, pp. 1-5, available at: https://reporter.nih.gov/search/CcM5mSDoAEGnsxLD5JYH1w/project-details/8834658.

Ahmadi, N., et al., "Towards a Distributed, Chronically-Implantable Neural Interface", in 2019 9th International IEEE/EMBS Conference on Neural Engineering, San Francisco, CA, Mar. 20-23, 2019, pp. 719-724.

Alcaraz, J. P., et al., "Tackling the Concept of Symbiotic Implantable Medical Devices with Nanobiotechnologies", in Biotechnology Journal, vol. 13, No. 12, Dec. 10, 2018, pp. 1-12.

Alivisatos, A. P., et al., "Neuroscience: The Brain Activity Map", in Science, vol. 339, No. 6125, Mar. 15, 2013, pp. 1284-1285.

Ando, H., et al., "Wireless Multichannel Neural Recording with a 128-Mbps UWB Transmitter for an Implantable Brain-Machine Interfaces", in IEEE Transactions on Biomedical Circuits and Systems, vol. 10, No. 6, Feb. 2016, pp. 1068-1078.

Arias, A.C., et al., "Materials and Applications for Large Area Electronics: Solution-based approaches", in Chemical Reviews, vol. 110, No. 1, Jan. 2010, pp. 3-24.

Benninger, D., et al., "Deep Brain Stimulation", in Therapeutische Umschau, Revue Therapeutique, vol. 75, No. 7, Jan. 2018, pp. 1-14.

Berggren, M. and Richter-Dahlfors, A., "Organic Bioelectronics", in Advanced Materials, Sep. 25, 2007, pp. 3201-3213.

Biederman, W., et al., "A Fully-Integrated, Miniaturized (0.125 mm2) 10.5 μW Wireless Neural Sensor", in IEEE Journal of Solid-State Circuits, vol. 48, No. 4, Mar. 2013, pp. 960-970.

Boccaccini, A. R., et al., "Composite Surgical Sutures with Bioactive Glass Coating", in Journal of Biomedical Materials Research: Part B, Applied Biomaterials, vol. 67, No. 1, Oct. 15, 2003, pp. 618-626.

Borton, D.A., et al., "An Implantable Wireless Neural Interface for Recording Cortical Circuit Dynamics in Moving Primates", in Journal of Neural Engineering, vol. 10, No. 2, Feb. 2013, pp. 1-25.

Braga, D., et al., "High-Transconductance Organic Thin-Film Electrochemical Transistors for Driving Low-Voltage Red-Green-Blue Active Matrix Organic Light-Emitting Devices", in Advanced Functional Materials, vol. 22, No. 8, Apr. 24, 2012, pp. 1623-1631.

Buzsaki, G. and Draguhn, A., "Neural Oscillations in Cortical Networks", in Science, vol. 304, No. 5679, Jun. 25, 2004, pp. 1926-1929.

Buzsaki, G., "Hippocampal Sharp Wave-Ripple: A cognitive biomarker for episodic memory and planning", in Hippocampus, vol. 25, No. 10, Jul. 2015, pp. 1073-1188.

Buzsáki, G., "Large-Scale Recording of Neuronal Ensembles", in Nature Neuroscience vol. 7, No. 5, Apr. 27, 2004, pp. 446-451.

Buzsáki, G., et al. "Tools for Probing Local Circuits: High-density silicon probes combined with optogenetics", in Neuron, Apr. 2015, pp. 92-105.

Buzsaki, G., et al., "High-Frequency Network Oscillation in the Hippocampus", in Science, vol. 256, No. 5059, May 1992, pp. 1025-1027.

Buzsáki, G., et al., "Scaling Brain Size, Keeping Timing: Evolutionary Preservation of Brain Rhythms", in Neuron, vol. 80, No. 3, Oct. 30, 2013, pp. 751-764.

Buzsaki, G., et al., "The Origin of Extracellular Fields and Currents— EEG, ECOG, LFP and Spikes", in National Review of Neuroscience, vol. 13, No. 6, Jun. 2012, pp. 407-420.

Campana, A., et al., "Electrocardiogramith Conformable Organic Electrochemical Transistor Fabricated on Resorbable Bioscaffold", in Advanced Materials, vol. 26, No. 23, Jun. 2014, pp. 3874-3878.

Canolty, R.T, et al., "Oscillatory Phase Coupling Coordinates Anatomically Dispersed Functional Cell Assemblies", in Proceedings of hte National Academy of Sciences, vol. 107, No. 40, Sep. 2010, pp. 17356-17361.

Cea, C., et al., "Enhancement-Mode Ion-Based Transistor as a Comprehensive Interface and Real-Time Processing Unit for in Vivo Electrophysiology", in Nature Materials, vol. 19, Mar. 16, 2020, pp. 1-11.

Challis, L. J., "Mechanisms for interaction between RF fields and biological tissue", in Bioelectromagnetics, vol. 26, Jun. 2005, pp. S98-S106 (i.e., pp. 1-9).

Chen, R., et al., "Neural Recording and Modulation Technologies", in Nature Review Materials, vol. 2, Feb. 2017, pp. 1-36.

Choi, H.H., et al., "Critical Assessment of Charge Mobility Extraction in FETs", in Nature Materials, vol. 17, Jan. 2018, pp. 2-7.

Chung, H.U., et al., "Binodal, Wireless Epidermal Electronic Systems with In-Sensor Analytics for Neonatal Intensive Care", in Science, vol. 363, No. 6430, Mar. 2019, pp. 1-13.

(56) References Cited

OTHER PUBLICATIONS

Crispin, X., et al., "The Origin of the High Conductivity of Poly(3,4-ethylenedioxythiphene)-poly (styrenesulfonate)(PEDOT-PSS) Plastic Electrodes", in Chemistry of Materials, vol. 18, Sep. 2006, pp. 4354-4360.
Cui, X., and Martin, D.C., "Electrochemical Deposition and Characterization of Poly (3,4-ethylenedioxythiophene) on Neural Microelectrode Arrays", in Sensors Actuators B Chemical, vol. 89, Mar. 2003, pp. 92-102.
David, R., "A Photochemically 3D Printed High-Resolution Biodegradable Suture Retention Clip", Deep Blue Medical Advances, Inc., NIH Grant R43GM140802, last accessed Nov. 13, 2023, pp. 1-4, available at: https://reporter.nih.gov/search/QjIDxDQPNkiF33G76PERSQ/project-details/10157051.
Dennis, C., et al., "Suture Materials—Current and Emerging Trends", in Journal of Biomedical Materials Research Part A, vol. 104, No. 6, Jun. 2016, pp. 1544-1559.
Duarah, R., et al., "Smart Self-Tightening Surgical Suture from a Tough Bio-Based Hyperbranched Polyurethane/Reduced Carbon Dot Nanocomposite", in Biomedical Materials, vol. 13, No. 4, Apr. 16, 2018, pp. 1-14.
Edis, Z., et al., ""Smart" Antimicrobial Nanocomplexes with Potential to Decrease Surgical Site Infections (SSI)", in Pharmaceutics, vol. 12, No. 4, Apr. 15, 2020, pp. 1-36.
Ellingson, R.J., "Electroencephalograms of Normal, Full-Term Newborns Immediately after Birth with Observations on Arousal and Visual Evoked Responses", in Electroencephalography and Clinical Neurophysiology, vol. 10, No. 1, Feb. 1958, pp. 31-50.
Fang, H., et al., "Capacitively Coupled Arrays of Multiplexed Flexible Silicon Transistors for Long-Term Cardiac Electrophysiology", in Nature Biomedical Engineering, vol. 1, Mar. 2017, pp. 1-12.
Fernandez-Ruiz, A., et al., "Long-Duration Hippocampal Sharp Wave Ripples Improve Memory", in Science, vol. 364, No. 6445, Jun. 14, 2019, pp. 1082-1086.
Feron, K., et al., "Organic Bioelectronics: materials and biocompatibility", in the International Journal of Molecular Sciences, vol. 19, No. 8, Aug. 2018, pp. 1-21.
Fuller, E.J., et al., "Parallel Programming of an Ionic Floating-Gate Memory Array for Scalable Neuromorphic Computing", in Science, vol. 364, No. 6440, Apr. 2019, pp. 570-574.
Gabriel, C., "Compilation of the Dielectric Properties of Body Tissues at RF and Microwave Frequencies", Technical Report, King's College London (United Kingdom) Dept of Physics, Jun. 1996, pp. 1-273.
Gagnon-Turcotte, G., et al., "A Wireless Optogenetic Headstage with Multichannel Electrophysiological Recording Capability", in Sensors, vol. 15, No. 9, Sep. 2015, pp. 22776-22797.
Gelinas, J.N., "Interictal Epileptiform Discharges Induce Hippocampal-Cortical Coupling in Temporal Lobe Epilepsy", in Nature Medicine, vol. 22, Apr. 2016, pp. 641-648.
Giovannitti, A., et al., "Controlling the Mode of Operation of Organic Transistors through Side-Chain Enginnering", in Proceedings of the National Academy of Sciences, vol. 113, No. 43, Oct. 10, 2016, pp. 12017-12022.
Gogolla, N., et al., "Sensory Integration in Mouse Insular Cortex Reflects GABA Circuit Maturation", in Neuron, vol. 83, No. 4, Aug. 20, 2014, pp. 894-905.
Gonzalez Otarula, K.A., et al., "Automated Seizure Detection Accuracy for Ambulatory EEG Recordings", in Neurology, vol. 92, No. 14, Apr. 2019, pp. e1540-e1546.
Gou, Z., et al., "Resting Frontal Gamma Power at 16, 24 and 36 Months Predicts Individual Differences in Language and Cognition at 4 and 5 Years", in Behavioural Brain Research, vol. 220, No. 2, Feb. 3, 2011, pp. 263-270.
Grahame, D.C., "The Electrical Double Layer and the Theory of Electrocapillarity", in Chemical Reviews, vol. 41, No. 3, Dec. 1947, pp. 441-501.
Grunert, P., "From the Idea to its Realization: The evolution of minimally invasive techniques in neurosurgery", in Neuroendoscopy, vol. 2013, Dec. 2013, pp. 1-19.
Hachisuka, K., et al., "Intra-Body Data Transmission for the Personal Area Network", in Microsystem Technologies, vol. 11, Jul. 2005, pp. 1020-1027.
Harris, K. D., et al. "Accuracy of Tetrode Spike Separation as Determined by Simultaneous Intracellular and Extracellular Measurements", in Journal of Neurophysiology, Jul. 2000, pp. 401-414.
Harrison, R.R., et al., "Wireless Neural Recording with Single Low-Power Integrated Circuit", in IEEE Transactions on Neural Systems and Rehabilitation Engineering, vol. 17, No. 4, Jun. 2009, pp. 322-329.
Hiraizumi, Y., et al., "Application of Polyvinyl Alcohol Hydrogel Membrane as Anti-Adhesive Interposition After Spinal Surgery", in Spine, vol. 20, No. 21, Nov. 1995, pp. 2272-2277.
Hochberg, L.R., et al., "Neuronal Ensemble Control of Prosthetic Devices by a Human with Tetraplegia", in Nature, vol. 442, Jul. 13, 2006, pp. 164-171.
IEEE Standards Coordinating Committee, "IEEE Standard for Safety Levels with Respect to Human Exposure to Radio Frequency Electromagnetic Fields, 3 kHz to 300 GHz", in IEEE Std C95.1, 1999 Edition, vol. 6, Apr. 1999, pp. 1-83.
II Chang, S., et al., "A Minimally-Invasive Neural Interface for Wireless Epidural Recording by Intra-skin Communication," in IEEE Symp. VLSI Circuits, Dig. Tech. Pap., Jun. 2011, pp. 146-147.
II Park, S., et al., "Soft, Stretchable, Fully Implantable Miniaturized Optoelectronic Systems for Wireless Optogenetics", in Nature Biotechnology, vol. 33, No. 12, Dec. 2015, pp. 1280-1286.
Imani, S., et al., "A Wearable Chemical-Electrophysiological Hybrid Biosensing System for Real-Time Health and Fitness Monitoring", in Nature Communications, vol. 7, May 2016, pp. 11650.
Inal, S., et al., "Benchmarking Organic Mixed Conductors for Transistors", in Nature Communications, vol. 8, Nov. 2017, pp. 1-7.
Inal, S., et al., "A High Transconductance Accumulation Mode Electrochemical Transistor", in Advanced Materials, vol. 26, No. 44, Oct. 2014, pp. 7450-7455.
International Patent Application No. PCT/US2019/068363, filed Dec. 23, 2019, pp. 1-52.
International Search Report and Written Opinion dated Apr. 7, 2020 in International Patent Application No. PCT/US2019/068363, pp. 1-160.
Itskov, V., "Theta-Mediated Dynamics of Spatial Information in Hippocampus", in the Journal of Neuroscience, vol. 28, No. 23, Jun. 2008, pp. 5959-5964.
Jastrzebska-Perfect, P., et al., "Mixed-Conducting Particulate Composites for Soft Electronics", in Science Advances, vol. 6, No. 17, Apr. 24, 2020, pp. 1-9.
Jastrzebska-Perfect, P., et al., "Translational Neuroelectronics", in Advanced Funcitonal Materials, vol. 30, No. 29, Jun. 2020, pp. 1-31.
Jeong, J.W., et al., "Soft Materials in Neuroengineering for Hard Problems in Neuroscience", in Neuron, vol. 86, No. 1, Apr. 8, 2015, pp. 175-186.
Jiang, H.L., et al., "Chitosan-Graft-Polyethylenimine as a Gene Carrier", in Journal of Controlled Release, vol. 117, No. 2, Feb. 12, 2007, pp. 273-280.
Jin, P., et al., "A Flexible, Stretchable System for Simultaneous Acoustic Energy Transfer and Communication", in Science Advances, vol. 7, No. 40, Sep. 2021, pp. 1-12.
Jobst, B.C., et al., "Brain-responsive Neurostimulation in Patients with Medically Intractable Seizures Arising from Eloquent and other Neocortical Areas", in Epilepsia, vol. 58, No. 6, Apr. 7, 2017, pp. 1005-1014.
Kalidasan, V., et al., "Wirelessly Operated Bioelectronic Sutures for the Monitoring of Deep Surgical Wounds", in Nature Biomedical Engineering, vol. 5, No. 10, Oct. 2021, pp. 1-23.
Kaltenbrunner, M., et al., "An Ultra-Lightweight Design for Imperceptible Plastic Electronics", in Nature, vol. 499, Jul. 24, 2013, pp. 458-463.
Khalifa, A., et al. "The Microbead: A Highly Miniaturized Wirelessly Powered Implantable Neural Stimulating System," in IEEE Trans. Biomed. Circuits Syst., Mar. 2018, pp. 521-531.

(56) References Cited

OTHER PUBLICATIONS

Khan, F., et al., "Versatile Biocompatible Polymer Hydrogels: Scaffolds for cell growth", in Angewandte Chemie International Edition, vol. 48, No. 5, Jan. 2009, pp. 978-982.
Khazipov, R., et al., "Early Motor Activity Drives Spindle Bursts in the Developing Somatosensory Cortex", in Nature, vol. 432, Dec. 9, 2004, pp. 758-761.
Khodagholy, D., et al., "Highly Conformable Conducting Polymer Electrodes for in Vivo Recordings", in Advanced Materials, vol. 23, No. 26, Aug. 9, 2011, pp. 1-5.
Khodagholy, D., et al., "NeuroGrid: recording action potentials from the surface of the brain", in Nature Neuroscience, vol. 18, Dec. 22, 2014, pp. 1-7.
Khodagholy, D., et al., "Organic Electronics for High-Resolution Electrocorticography of the Human Brain", in Science Advances, vol. 2, No. 11, Nov. 9, 2016, pp. 1-9.
Kim, C.Y., et al., "Soft Subdermal Implant Capable of Wireless Battery Charging and Programmable Controls for Applications in Optogenetics", in Nat. Commun. Jan. 12, 2021, pp. 1-13.
Kim, K., et al., "A Carbon Nanotube Synapse with Dynamic Logic and Learning", in Advanced Materials, vol. 25, Mar. 2013, pp. 1693-1698.
Kim, S.H., et al., "Electrolyte-Gated Transistors for Organic and Printed Electronics", in Advanced Materials, vol. 25, No. 13, Apr. 2013, pp. 1822-1846.
Kim, Y., et al., "A Bioinspired Flexible Organit Artificial Afferent Nerve", in Science, vol. 360, No. 6392, Jun. 2018, pp. 998-1003.
King, R.W.P., et al., "The Electromagnetic Field of an Insulated Antenna in a Conducting or Dielectric Medium", in IEEE Transactions on Microwave Theory Technology, vol. 31, No. 7, Jul. 1983, pp. 574-583.
Lee, B., et al., "Single-Center Experience with the NeuroPace RNS System: A Review of Techniques and Potential Problems", in World Neurosurgery, vol. 84, No. 3, Sep. 2015, pp. 719-726.
Lee, J., et al., "Ion Gel Gated Polymer-Thin-Film Transistors", in Journal of the American Chemical Society, vol. 129, No. 15, Apr. 2007, pp. 4532-4533.
Lee, J., et al., "Neural Recording and Stimulation Using Wireless Networks of Microimplants", in Nature Electronics, vol. 4, Aug. 12, 2021, pp. 604-614.
Lee, W., et al., "Transparent, Conformable Active Multielectrode Array using Organic Electochemical Transistors", in Proceedings of the National Academy of Sciences, vol. 114, No. 40, Sep. 2017, pp. 1-6.
Leonard, S., et al., "Smart Tissue Anastomosis Robot (STAR): A Vision-Guided Robotics System for Laparoscopic Suturing", in IEEE Transactions on Biomedical Engineering, vol. 61, No. 4, Apr. 2014, pp. 1305-1317.
Li, J., et al., "Body-Coupled Power Transmission and Energy Harvesting", in Nature Electronics, vol. 4, Jun. 2021, pp. 530-538.
Li, Q., et al., "Stable Thin-Film Reference Electrode on Plastic Substrate for All-Solid-State Ion-Sensitive Field-Effect Transistor Sensing System", in IEEE Electron Device Letters, vol. 38, No. 10, Oct. 2017, pp. 1469-1472.
Liang, W., et al., "A Multifunctional Green Antibacterial Rapid Hemostasis Composite Wound Dressing for Wound Healing", in Biomaterials Science, vol. 9, No. 21, Sep. 2021, pp. 7124-7133.
Lin, Z., et al., "A Work-Function Tunable Polyelectrolyte Complex (PEI:PSS) as a Cathode Interfacial layer for Inverted Organic Solar Cells", in Journal of Materials Chemistry, vol. 21, Jun. 2014, pp. 1-8.
Maingret, N., et al., "Hippocampo-Cortical Coupling Mediates Memory Consolidation During Sleep", in Nature Neuroscience, vol. 19, No. 7, May 16, 2016, pp. 1-19.
Malliaras, G.G., "Next-Generation Probes, Particles, and Proteins for Neural Interfacing", in Science Advances, vol. 3, No. 6, Jun. 9, 2017, pp. 1-20.
Meglinski, I. V., et al. "Quantitative Assessment of Skin Layers Absorption and Skin Reflectance Spectra Simulation in the Visible and Near-infrared Spectral Regions", in Physiol. Meas., Oct. 2002, pp. 741-753.
Meng, X., et al., "Electrosynthesis of Pure Poly(3,4-ethylenedioxythiophene)(PEDOT) in Chitosan-Based liquid Crystal Phase", in Electronic Materials Letters, vol. 9, Sep. 2013, pp. 605-608.
Merletti, R., et al., "Analysis of Intramuscular Electromygogram Signals", in Philosophical Transactions of the Royal Society, vol. 367, No. 1887, Jan. 2009, pp. 1-14.
Mian, M.K., et al., "Deep Brain Stimulation for Obsessive-Compulsive disorder: Past, present, and future", in Journal of Neurosurgery, vol. 20, No. 2, Aug. 2010, pp. 1-9.
Minlebaev, M., et al., "Early Gamma Oscillations Synchronize Developing Thalamus and Cortex", in Science, vol. 334, No. 6053, Oct. 14, 2011, pp. 226-229.
Miranda, H., et al. "A High-Rate Long-Range Wireless Transmission System for Simultaneous Multichannel Neural Recording Applications", in IEEE Transactions Biomedical Circuits Systems, vol. 4, No. 3, Jun. 2010, pp. 181-191.
Morrell, M.J., "Responsive Cortical Stimulation for the Treatment of Medically Intracable Partial Epilepsy", in Neurology, vol. 77, No. 13, Sep. 2011, pp. 1295-1304.
Mostafalu, P., et al., "A Toolkit of Thread-Based Microfluidics, Sensors, and Electronics for 3D Tissue Embedding for Medical Diagnostics", in Microsystems & Nanoengineering, vol. 2, No. 16039, Jul. 18, 2016, pp. 1-10.
Muller, R., et al., "A minimally invasive 64-channel wireless µECoG implant", in IEEE Journal of Solid-State Circuits, vol. 50, No. 1, Jan. 2015, pp. 344-359.
Nicolelis, M. A. L., et al., "Hebb's Dream: The Resurgence of Cell Assemblies", in Neuron, vol. 19, Aug. 1997, pp. 219-221.
Nielsen, C.B., et al., "Molecular Design of Semiconducting Polymers for High-Performance Organic Electrochemical Transistors", in the Journal of the American Chemical Society, vol. 138, No. 32, Jul. 2016, pp. 10252-10259.
Normann, R. A., et al., "A Neural Interface for a Cortical Vision Prosthesis", in Vision Research, vol. 39, No. 15, Jul. 1999, pp. 2577-2587.
Office Action dated Feb. 20, 2024 in U.S. Appl. No. 17/022,004, pp. 1-7.
Panzer, M.J. and Frisbie, C.D., "Polymer Electrolyte-Gated Organic Field-Effect Transistors: low-voltage, high-current switches for organic electronics and testbeds for probing electrical transport at high charge carrier density", in the Journal of the American Chemical Society, vol. 129, No. 20, May 2007, pp. 6599-6607.
Paulsen, B.D., et al., "Organic Mixed Ionic-Electronic Conductors", in Nature Materials, vol. 19, Jan. 2020, pp. 1-37.
Peyrache, A., et al., "Inhibition Recruitment in Prefrontal Cortex during Sleep Spindles and Gating of Hippocampal Inputs", in Proceedings of the National Academy of Sciences, vol. 108, No. 41, Sep. 2011, pp. 17207-17212.
Phan, P. T., et al., "Smart Surgical Sutures Using Soft Artificial Muscles", in Scientific Reports, vol. 11, No. 1, Nov. 17, 2021, pp. 1-16.
Piech, D. K., et al., "A Wireless Millimetre-scale Implantable Neural Stimulator with Ultrasonically Powered Bidirectional Communication", in Nat. Biomed. Eng. 4, Feb. 2020, pp. 207-222.
Piech, D.K., et al., "Rodent Wearable Ultrasound System for Wireless Neural Recording", in Proceedings of the 39th Annual International Conference of the IEEE Engineering in Medicine and Biology Society (EMBC), Jeju, South Korea, Jul. 11-15, 2017, pp. 221-225.
Podzorov, V., "Organic Single Crystals: Addressing the fundamentals of organic electronics", in MRS Bulletin, vol. 38, No. 1, Jan. 2013, pp. 15-24.
Ramgopal, S., et al., "Seizure Detection, Seizure Prediction, and Closed-Loop Warning Systems in Epilepsy", in Epilepsy and Behavior, vol. 37, Aug. 2014, pp. 291-307.
Ramuz, M., et al., "Combined Optical and Electronic Sensing of Epithelial Cells using Planar Organic Transistors", in Advanced Materials, vol. 26, No. 41, Nov. 2014, pp. 7083-7090.

(56) References Cited

OTHER PUBLICATIONS

Reaz, M.B.I, et al., "Techniques of EMG Signal Analysis: Detection, processing, classification and applications", in Biological Procedures Online, vol. 8, Dec. 2006, pp. 11-35.
Rigante, S., et al., "Sensing with Advanced Computing Technology" Fin Field-Effect Transistors wtih High-k Gate Stack on Bulk Silicon, in ACS Nano, vol. 9, No. 5, Mar. 2015, pp. 4872-4881.
Rivnay, J., et al., "High-Performance Transistors for Biolectronics through Tuning of Channel Thickness", in Science Advances, vol. 1, No. 4, May 2015, pp. 1-5.
Rivnay, J., et al., "The Rise of Organic Bioelectronics", in Chemistry of Materials, vol. 26, No. 1, Jan. 14, 2014, pp. 679-685.
Rizk, M., et al., "A Single-Chip Signal Processing and Telemetry Engine for an Implantable 96-Channel Neural Data Acquisition System", in the Journal of Neural Engineering, vol. 4, No. 309, Sep. 2007, pp. 309-321.
Roberts, M.E., et al., "Water-Stable Organic Transistors and their Application in Chemical and Biological Sensors", in Proceedings of the National Academy of Science, vol. 105, No. 34, Aug. 26, 2008, pp. 12134-12139.
Rohenkohl, G., et al., "Gamma Synchronization between V1 and V4 Improves Behavioral Performance", in Neuron, vol. 100, No. 4, Oct. 11, 2018, pp. 1-15.
Rosell, J., et al., "Skin Impedance from 1 Hz to 1 MHz", in IEEE Transactions Biomedical Engineering, vol. 35, No. 8, Aug. 1988, pp. 649-651.
Sani, N., et al., "All-Printed Diode Operating at 1.6GHz", in Applied Physical Sciences, vol. 111, No. 33, Jul. 2014, pp. 11943-11948.
Schmode, P., et al., "High-Performance Organic Electrochemical Trasnistors Based on Conjugated Polyelectrolyte Copolymers", in Chemistry of Materials, vol. 31, No. 14, Jun. 2019, pp. 5286-5295.
Seelke, A.M.H., and Blumberg, M.S., "Developmental Appearance and Disappearance of Cortical Events and Oscillations in Infant Rats", in Brain Research, vol. 1324, Feb. 6, 2010, pp. 34-42.
Seo, D., et al., "Wireless Recording in the Peripheral Nervous System with Ultrasonic Neural Dust", in Neuron, vol. 91, Aug. 2016, pp. 528-539.
Sessolo, M., et al., "Easy-to-Fabricate Conducting Polymer Microelectrode Arrays", in Advanced Materials, vol. 25, No. 15, Feb. 2013, pp. 2135-2139.
Seymour, J.P., and Kipke, D.R., "Neural Probe Design for Reduced Tissue Encapsulation in CNS", in Biomaterials, vol. 28, No. 25, Apr. 9, 2007, pp. 3594-3607.
Sirota, A., et al., "Entrainment of Neocortical Neurons and Gamma Oscillations by the Hippocampal Theta Rhythm", in Neuron, vol. 60, No. 4, Nov. 26, 2008, pp. 1-15.
Sodagar, A.M., et al., "An Implantable Microsystem for Wireless Multi-Channel Cortical Recording", in Proceedings of Transducers 2007 International Solid-State Sensors, Actuators and Microsystems Conference, Lyon, France, Jun. 10-14, 2007, pp. 69-72.
Someya, T., et al., "The Rise of Plastic Bioelectronics", in Nature, vol. 540, Dec. 2016, pp. 379-385.
Song, C., et al., "An Injectable Conductive Three-Dimensional Elastic Network by Tangled Surgical-Suture Spring for Heart Repair", in ACS Nano, vol. 13, No. 12, Dec. 2019, pp. 14122-14137.
Song, E., et al., "Flexible Electronic/Optoelectronic Microsystems with Scalable Designs for Chronic Biointegration", in Proceedings of the National Academy of Sciences, vol. 116, No. 31, Jul. 15, 2019, pp. 15398-15406.
Stavrinidou, E., et al. "Direct measurement of ion mobility in a conducting polymer", in Advanced Materials, vol. 25, No. 32, Jun. 20, 2013, pp. 1-6.
Strakosas, X., et al., "The Organic Electrochemical Transistor for Biological Applications", in the Journal of Applied Polymer Science, vol. 132, No. 15, Apr. 2015, pp. 1-14.
Szuts, T.A., et al., "A Wireless Mutli-Channel Neural Amplifier for Freely Moving Animals", in Nature Neuroscience, vol. 14, Jan. 2011, pp. 263-269.

Tang, N., et al., "Highly Efficient Self-Healing Multifunctional Dressing with Antibacterial Activity for Sutureless Wound Closure and Infected Wound Monitoring", in Advanced Materials, vol. 34, No. 3, Nov. 5, 2021, pp. 1-12.
Topalovic, U., et al., "Wireless Programmable Recording and Stimulation of Deep Brain Activity in Freely Moving Humans", in Neuron, vol. 108, No. 2, Oct. 2020, pp. 322-334.e9.
Tria, S.A., et al., "Dynamic Monitoring of Salmonella Typhimurium Infection of Polarized Epithelia using Organic Transistors", in Advanced Healthcare Materials, vol. 3, No. 7, Jul. 2014, pp. 1053-1060.
Tybrandt, K., et al., "Chemical Potential-Electric Double Layer Coupling in Conjugated Polymer-Polyelectrolyte Blends", in Science Advances, vol. 3, No. 12, Dec. 2017, pp. 1-7.
Tybrandt, K., et al., "High-Density Stretchable Electrode Grids for Chronic Neural Recording", in Advanced Materials, vol. 30., No. 15, Feb. 28, 2018, pp. 1-7.
U.S. Appl. No. 17/022,004, filed Sep. 15, 2020, pp. 1-40.
U.S. Appl. No. 18/106,467, filed Feb. 6, 2023, pp. 1-23.
U.S. Appl. No. 18/118,044, filed Mar. 6, 2023, pp. 1-17.
U.S. Appl. No. 62/784,315, filed Dec. 21, 2018, pp. 1-44.
U.S. Appl. No. 62/900,633, filed Sep. 15, 2019, pp. 1-28.
U.S. Appl. No. 62/952,692, filed Dec. 23, 2019, pp. 1-93.
U.S. Appl. No. 63/307,152, filed Feb. 6, 2022, pp. 1-28.
U.S. Appl. No. 63/316,986, filed Mar. 5, 2022, pp. 1-47.
Vaz, A., et al., "Coupled Ripple Oscillations between the MTL and Neocortex retreive Human Memory", in Science, vol. 363, No. 6430, Mar. 2019, pp. 975-978.
Velliste, M., et al., "Cortical Control of a Prosthetic Arm for Self-Feeding", in Nature, vol. 453, May 28, 2008, pp. 1098-1101.
Vetter, R.J., et al., "Chronic Neural Recording Using Silicon-Substrate Microelectrode Arrays Implanted in Cerebral Cortex", in IEEE Transactions on Biomedical Engineering, vol. 51, No. 6, Jul. 2011, pp. 896-904.
Viventi, J., et al., "Flexible, Foldable, Actively Multiplexed, High-Density Electrode Array for Mapping Brain Activity in Vivo", in Nature Neuroscience, vol. 14, Nov. 2011, pp. 1599-1605.
Voloh, B., et al., "Theta-Gamma Coordination Between Anterior Cingulate and Prefrontal Cortex Indexes Correct Attention Shifts", in Proceedings of the National Academy of Sciences, vol. 112, No. 27, Jun. 22, 2015, pp. 8457-8462.
Wang, S., et al., "Chitosan/Gelatin Porous Scaffolds Assembled with Conductive Poly (3,4-ethylenedioxythiophene) Nanoparticles for Neural Tissue Engineering", in Journal of Materials Chemistry, vol. 24, May 2017, pp. 4774-4788.
Wellman, S. M., et al., "A Materials Roadmap to Functional Neural Interface Design", in Advanced Functional Materials, Jul. 19, 2017, pp. 1-38.
Wilson, M.A., and McNaughton, B.L., "Dynamics of the Hippocampal Ensemble Code for Space", in Science, vol. 261, No. 5124, Aug. 20, 1993, pp. 1055-1058.
Wimmer, R.D., et al., "Sustaining Sleep Spindles through Enhanced SK2-Channel Activity Consolidates Sleep and Elevates Arousal Threshold", in the Journal of Neuroscience, vol. 32, No. 40, Oct. 2012, 13917-13928.
Won, S.M., et al., "Wireless and Battery-free Technologies for Neuroengineering", in Nat. Biomed. Eng., Mar. 2021, pp. 405-423.
Xuan, Y., et al., "An All-Polymer-Air PEDOT Battery", in Organic Electronics, vol. 13, No. 4, Apr. 2012, pp. 632-637.
Yang, J. W., et al., "Three Patterns of Oscillatory Activity Differentially Synchronize Developing Neocortical Networks in Vivo", in Journal of Neuroscience, vol. 29, No. 28, Jul. 15, 2009, pp. 9011-9025.
Yin, M., and Ghovanloo, M., "A Low-noise Clockless Simultaneous 32-channel Wireless Neural Recording System with Adjustable Resolution", in Analog Integrated Circuits and Signal Processing, vol. 66, Nov. 21, 2010, pp. 417-431.
Yin, M., et al., "Wireless Neurosensor for Full-Spectrum Electrophysiology Recordings during Free Behavior", in Neuron, Dec. 2014, pp. 1170-1182.
Zare Bidoky, F., et al., "Sub-3 V ZnO Electrolyte-Gated Transistors and Circuits with Screen-Printed and Photo-Crosslinked Ion Gel

(56) References Cited

OTHER PUBLICATIONS

Gate Dielectrics: new Routes to Improved Performance", in Advanced Functional Materials, vol. 30, No. 20, May 2019, pp. 1-26.

Zeglio, E., et al., "Conjugated Polyelectrolyte Blends for Electrochromic and Electrochmical Transistor Devices", in Chemistry of Materials, vol. 27, No. 18, Aug. 2015, pp. 6385-6393.

Zhao, Z., et al., "Responsive Manipulation of Neural Circuit Pathology by Fully Implantable, Front-End Multiplexed Embedded Neuroelectronics", in Proceedings of the National Academy of Sciences, vol. 118, No. 20, May 2021, pp. 1-9.

Zhou, A., et al., "A Wireless and Artefact-free 128-channel Neuromodulation Device for Closed-loop Stimulation and Recording in Non-human Primates", in Nature Biomedical Engineering, vol. 3, Dec. 2018, pp. 15-26.

Zhou, Y., et al., "A Universal Method to Produce Low-Work Function Electrodes for Organic Electronics", in Science, vol. 336, No. 6079, Apr. 2012, pp. 327-332.

Zimmerman, T.G., "Personal Area Networks: Near-field Intrabody Communication", In IBM Syst. J., Mar. 1996, pp. 1-81.

Zozoulenko, I., et al., "Polarons, Bipolarons, and Absorption Spectroscopy of PEDOT", in ACS Applied Polymer Materials, Jan. 2019, pp. 83-94.

\* cited by examiner

INTERNAL-ION GATED ELECTROCHEMICAL TRANSISTORS

CROSS REFERENCE TO RELATED APPLICATIONS

This application is a continuation of International Patent Application No. PCT/US2019/068363, filed Dec. 23, 2019, which claims the benefit of U.S. Provisional Application No. 62/784,315, filed Dec. 21, 2018, and U.S. Provisional Application No. 62/952,692, filed Dec. 23, 2019, each of which is hereby incorporated by reference herein in its entirety.

TECHNICAL FIELD

The disclosed subject matter relates to internal-ion gated electrochemical transistors.

BACKGROUND

Electronic systems that can acquire, process, and interact with biological substrates are increasingly used to understand dynamic living organisms and treat human disease. These responsive systems are critical for establishing causality in complex experimental paradigms and have been shown to increase efficacy and tolerability of therapy for a range of disorders. Transistors are necessary components of these systems, forming the building blocks of circuits capable of performing specific operations such as signal amplification, filtering, detection of signal characteristics, and delivery of electrical or chemical stimulation. Prior attempts at providing transistors for such applications have been deficient in a variety of aspects.

Accordingly, it is desirable to provide new internal-ion gated electrochemical transistors.

SUMMARY

Internal-ion gated electrochemical transistors are provided.

In accordance with some embodiments of the disclosed subject matter, an internal-ion gated electrochemical transistor is provided, the internal-ion gated electrochemical transistor comprising: a gate electrode, a source electrode, and a drain electrode; a channel formed between the source electrode and the drain electrode, wherein the channel comprises a material that includes a conducting polymer and a biocompatible solution, wherein the channel serves as a reservoir of positively charged mobile ions; and an ion membrane between the channel and the gate electrode, wherein: in an off state of the internal-ion gated electrochemical transistor, at least a subset of the positively charged mobile ions are ionically bonded to negatively charged ions of the conducting polymer, and wherein in an on state of the internal-ion gated electrochemical transistor, at least a subset of the positively charged mobile ions are unbonded from the negatively charged ions of the conducting polymer to induce a current within the channel, and wherein at least one of the off state and the on state of the internal-ion gated electrochemical transistor is actuated by application of a voltage to the gate electrode.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
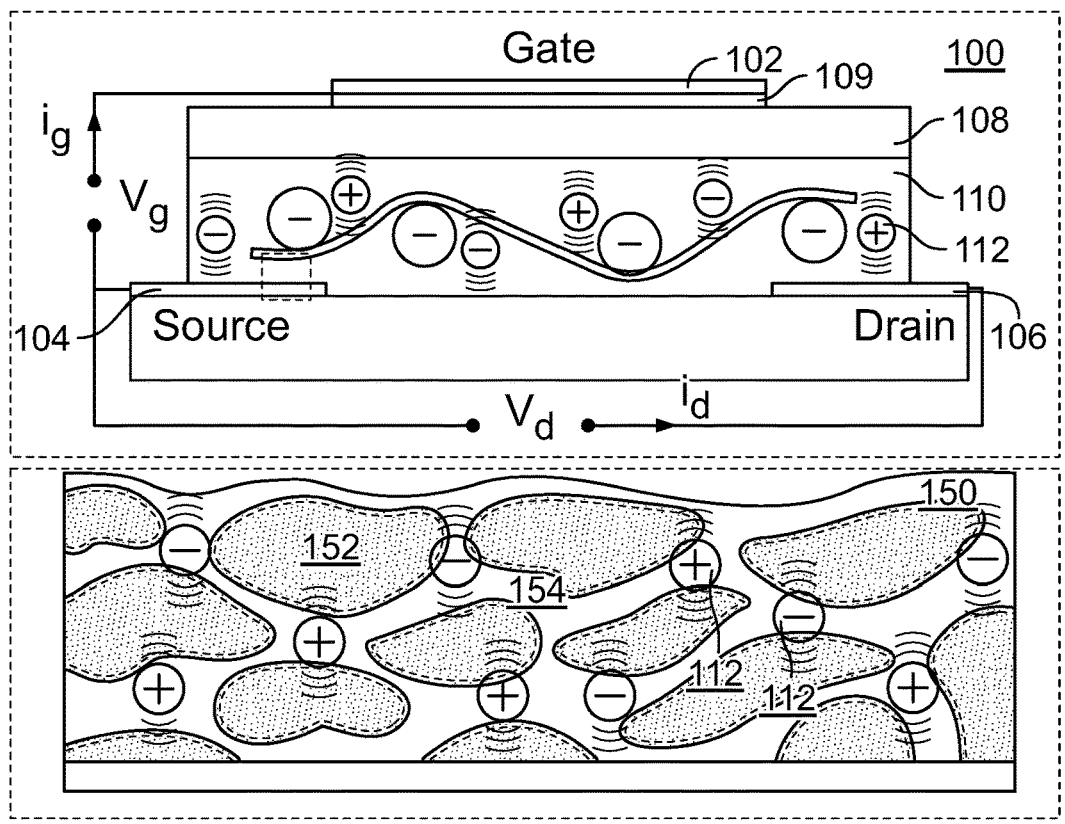
FIG. 1 shows example schematic diagrams of a depletion mode internal-ion gated electrochemical transistor (d-IGT) in accordance with some embodiments of the disclosed subject matter.

In accordance with various embodiments, internal-ion gated electrochemical transistors (IGTs) are provided.

In accordance with some embodiments, IGTs that use contained mobile ions within a conducting polymer channel to permit both volumetric capacitance and shortened ionic transit time are provided. In some embodiments, the mobile ions contained within the conducting polymer channel can create a self-de/doping process that eliminates the need for ion exchange from a shared external electrolyte. In some embodiments, due to the contained mobile ions within the polymer channel, IGTs can have high transconductance and high speed. Additionally, note that, in some embodiments, due to inclusion of an ion membrane between a channel of an IGT and a gate electrode of the IGT, IGTs can be independently gated to create scalable, conformable integrated circuits.

As shown in and described below in more detail in connection with FIG. 1, depletion mode IGTs (d-IGTs) are provided. Note that a voltage that is applied to generate a voltage between a gate electrode and a source electrode of an IGT is referred to herein as $V_G$. In some embodiments, d-IGTs can operate such that the d-IGT is in an ON state when there is no voltage between a gate electrode and a source electrode ($V_G=0V$) due to ions in a channel of the d-IGT causing a current between the source electrode and a drain electrode in an intrinsic state of the d-IGT. In some embodiments, a d-IGT can be turned OFF by applying a positive voltage between the gate electrode and the source electrode ($V_G>0V$). Continuing with this example, in some embodiments, the d-IGT can then be turned ON by the voltage between the gate electrode and the source electrode (such that $V_G=0V$).

Additionally, as shown in and described below in more detail in connection with FIG. 12, enhancement mode IGTs (e-IGTs) are provided. In some embodiments, e-IGTs can operate such that the e-IGT is in an OFF state when there is no voltage between a gate electrode and a source electrode ($V_G=0V$). In some embodiments, an e-IGT can be turned ON by applying a negative voltage between the gate electrode and the source electrode ($V_G<0V$). Continuing with this example, in some embodiments, the e-IGT can then be turned OFF by removing the voltage between the gate electrode and the source electrode (such that $V_G=0V$).

In some embodiments, an IGT (a d-IGT and/or an e-IGT) can be repetitively doped and de-doped based on a voltage between a gate electrode and a source electrode of the IGT. For example, in some embodiments, in a doped state, mobile cations in a channel of an IGT can be unbonded from anions of a polymer in a channel of the IGT, thereby increasing the conductivity in the channel. Continuing with this example, in some embodiments, in a de-doped state, the mobile cations can be ionically bonded to the anions of the polymer in the channel of the IGT, thereby decreasing the conductivity in the channel. In some embodiments, the IGT can switch between the doped and de-doped state based on the voltage between the gate electrode and the source electrode. That is, in some embodiments, a "doped" state of an IGT can correspond to an ON state of the IGT, and a "de-doped" state of an IGT can correspond to an OFF state of the IGT.

In some embodiments, IGTs can be used for any suitable applications, such as recording biomedical and/or neurophysiological data. For example, in some embodiments, IGTs can be fabricated to create a comfortable interface with human skin and using local amplification to record high quality electrophysiological activity (e.g., electrocardiogram (ECG) activity, electromyography (EMG) activity, electroencephalogram (EEG) activity, and/or any other suitable electrophysiological activity). As another example, in some embodiments, IGTs can be miniaturized and fabricated for insertion (e.g., in a cortical layer of a brain, and/or in any other suitable location) for recording any suitable neurophysiological activity (e.g., local field potentials (LFPs), action potentials, and/or any other suitable neurophysiological activity).

Turning to FIG. 1, an example 100 of a schematic diagram of a d-IGT is shown in accordance with some embodiments of the disclosed subject matter. As illustrated, d-IGT 100 can include a gate electrode 102, a source electrode 104, and a drain electrode 106. In some embodiments, each of gate electrode 102, source electrode 104, and drain electrode 106 can be made of any suitable material, such as gold (Au on the periodic table), and/or any other suitable material(s).

As illustrated in FIG. 1, in some embodiments, d-IGT 100 can include a channel 110 between source electrode 104 and drain electrode 106. In some embodiments, channel 110 can be made of any suitable material or combination of materials that can provide a supply of ions and that can facilitate movement of ions, such as ion 112, within channel 110. For example, in some embodiments, channel 110 can be made of a conducting polymer, such as poly(3,4-ethylenedioxythiophene)-poly(styrenesulfonate) (PEDOT:PSS). As another example, in some embodiments, channel 110 can include a conducting polymer that is combined with any suitable material that can provide an ion reservoir. As a more particular example, in some embodiments, the ion reservoir can include mobile ions of any suitable type, such as ions from a salt (e.g., KCl, NaCl, $MgCl_2$, $CaCl_2$), and/or any other suitable salt). In some embodiments, channel 110 can be made of a combination of PEDOT:PSS with any suitable biocompatible hydrophilic sugar alcohol that uptakes water molecules, such as D-sorbitol, which can keep channel 110 hydrated. Note that, in some embodiments, any other suitable materials can be included in channel 110. For example, in some embodiments, any suitable solvent, such as ethylene glycol, can be added to increase the conductivity of PEDOT:PSS within channel 110. Additionally, note that, in some embodiments, channel 110 can have any suitable length and width, as described below in more detail in connection with FIGS. 8A, 8B, and 8C.

As illustrated in FIG. 1, in some embodiments, d-IGT 100 can include an ion membrane 108 that can be between gate electrode 102 and channel 110. In some embodiments, ion membrane 108 can allow gate electrode 102 to have efficient ionic, but not electronic, conduction with the bulk of channel 110. In some embodiments, ion membrane 108 can be made of any suitable material. For example, in some embodiments, ion membrane 108 can be made of any suitable biocompatible and stable material, such as chitosan. In some embodiments, any other suitable biocompatible and stable material can be used in ion membrane 108, such as gelatin, polyvinyl alcohol (PVA), PVA:PSS, and/or any other suitable biopolymer. Note that, in some embodiments, to reduce an electrochemical impedance between gate electrode 102 and ion membrane 108, a layer of the conducting polymer (e.g., PEDOT:PSS) can be deposited onto gate electrode 102, as shown by layer 109 of FIG. 1.

Schematic 150 shows an example of a cross-sectional view of channel 110 of d-IGT 100. As illustrated, channel 110 can include PEDOT-rich regions 152 and PSS lamellas 154.

In some embodiments, d-IGT 100 can operate in depletion mode. That is, in some embodiments, d-IGT can be in an ON state when a gate voltage of $V_G$=0V is applied, and conversely, can be in an OFF state when a positive gate voltage is applied. In particular, when a positive gate voltage is applied, mobile ions within the ion reservoir that are in the vicinity of PEDOT-rich regions (e.g., of region 152, such as shown in FIG. 1) of the polymer of the channel of the d-IGT can compensate or ionically bond to the sulphonate anions on the PSS (e.g., of PSS lamella 154, such as shown in FIG. 1). In some embodiments, this process can lead to a decrease of the hole density in the PEDOT, and consequently a decrease in the channel current, corresponding to the OFF state of the d-IGT. In some embodiments, the reaction can be reversed when a negative gate voltage is applied. More particularly, in some embodiments, in response to a negative gate voltage being applied (or a gate voltage of $V_G$=0V), the ions can unbond from PEDOT of the channel to lead to an increase in channel current, corresponding to the ON state of the d-IGT.

Figure 2:
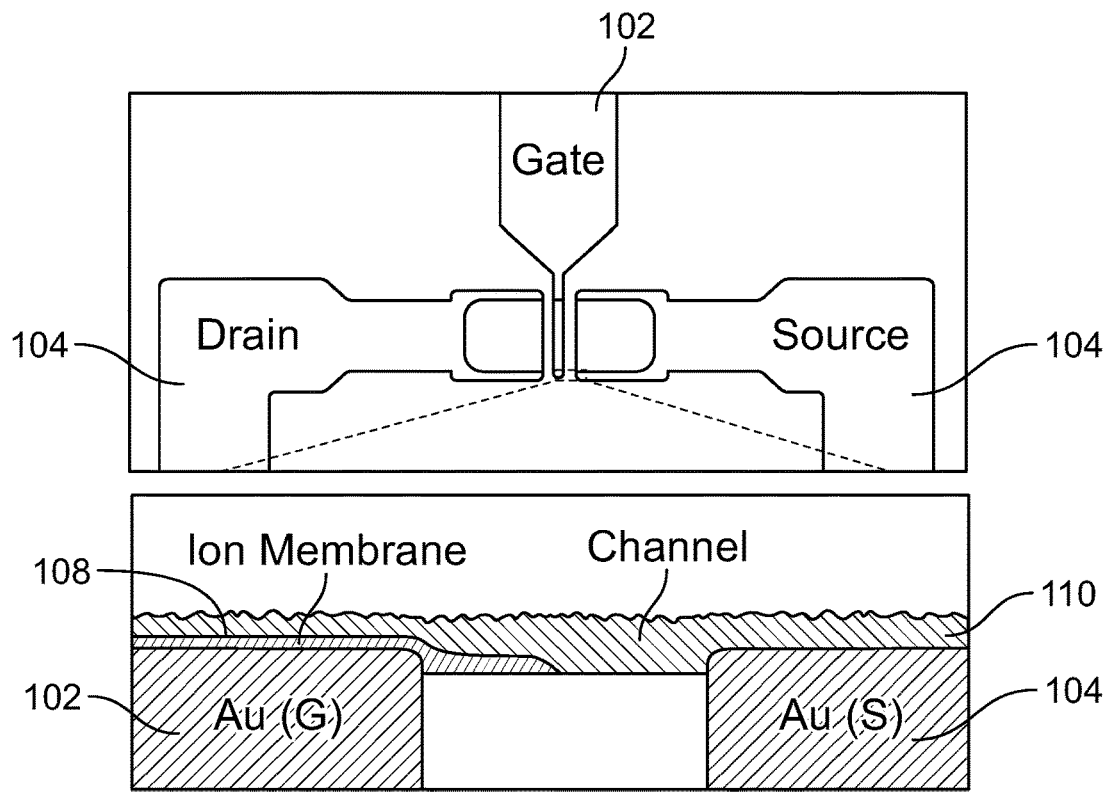
FIG. 2 shows a top view of a d-IGT in accordance with some embodiments of the disclosed subject matter.

Turning to FIG. 2, a top view 200 of an IGT taken with an optical micrograph is shown in accordance with some embodiments of the disclosed subject matter. As illustrated, top view 200 shows gate electrode 102, source electrode 104, drain electrode 106, ion membrane 108, and channel 110.

Figure 3A:
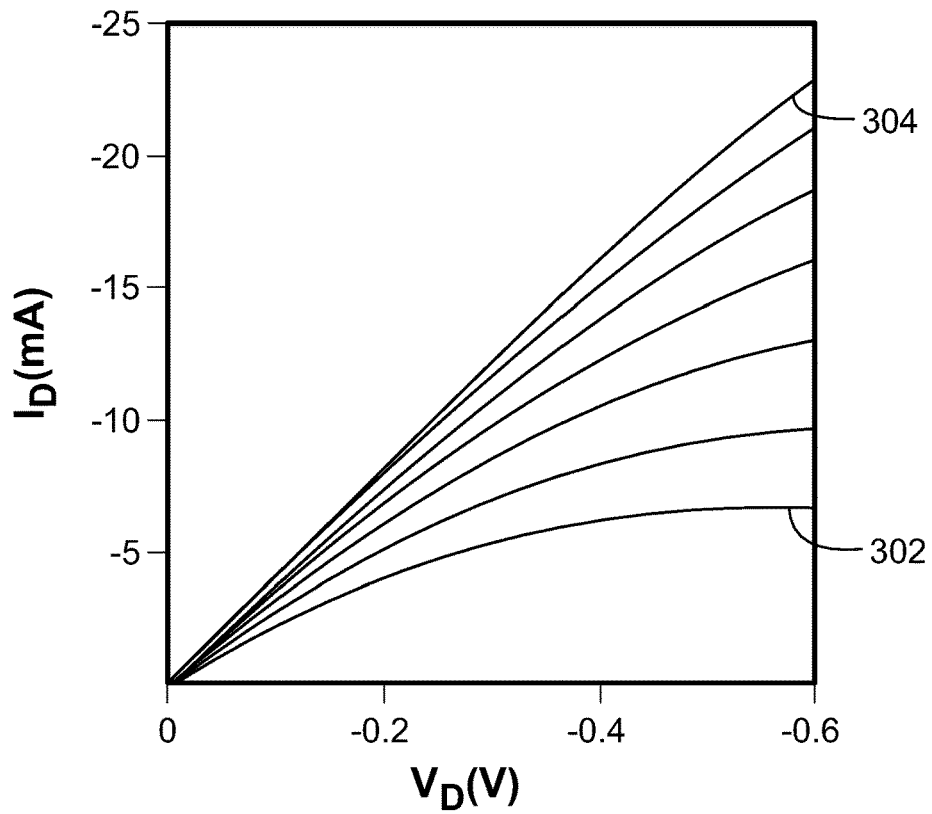
FIGS. 3A and 3B show output characteristics of a d-IGT in accordance with some embodiments of the disclosed subject matter.

Turning to FIG. 3A, output characteristics ($I_D$-$V_D$) of a d-IGT are shown in accordance with some embodiments of the disclosed subject matter. FIG. 3A includes multiple $I_D$-$V_D$ curves, each corresponding to a different gate voltage, $V_G$. For example, FIG. 3A includes a curve 302 corresponding to a gate voltage of $V_G$=+0.6V, and a curve 304 corresponding to a gate voltage of $V_G$=0V.

Figure 3B:
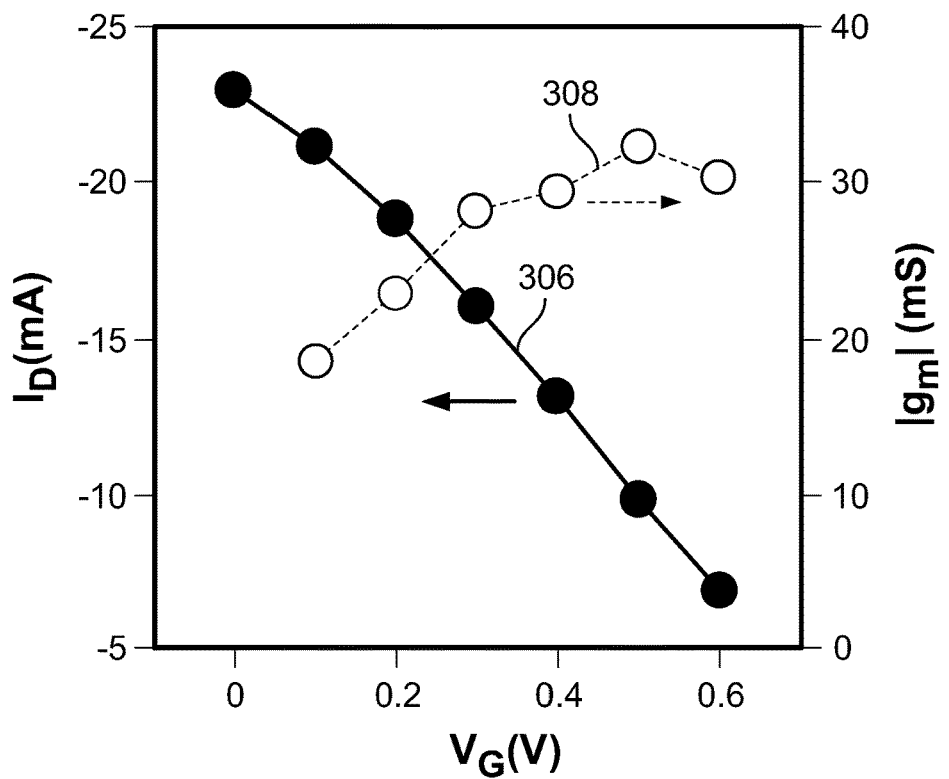

Turning to FIG. 3B, a transfer curve 306 of a d-IGT with a drain voltage of $V_D$=−0.6V that shows drain current $I_D$ as a function of an applied gate voltage is shown in accordance with some embodiments of the disclosed subject matter. FIG. 3B also shows a corresponding transconductance curve 308 in accordance with some embodiments of the disclosed subject matter.

Note that the $I_D$-$V_D$ curves shown in FIG. 3A, the transfer curve shown in FIG. 3B, and the transconductance curve shown in FIG. 3B were measured using a d-IGT with a channel length of 5 μm and a width of 500 μm. In some embodiments, a d-IGT with different channel dimensions can have different characteristics, such as shown in and described below in connection with FIGS. 8A, 8B, and 8C.

Additionally, note that, in some embodiments, characteristics of a d-IGT can be based on the mixture of ions in the PEDOT:PSS dispersion that is included in a channel of the d-IGT. For example, in some embodiments, ions with large hydrated radii, such as $Mg^{2+}$ and $Ca^{2+}$, can exhibit relatively slower modulation. As another example, in some embodiments, monovalent ions with smaller hydrated radii, such as Na+ and K+, can have relatively faster time constants. Note that, in some embodiments, a d-IGT with particular time constant characteristics can be fabricated by including a particular salt species in the channel.

Figure 4B:
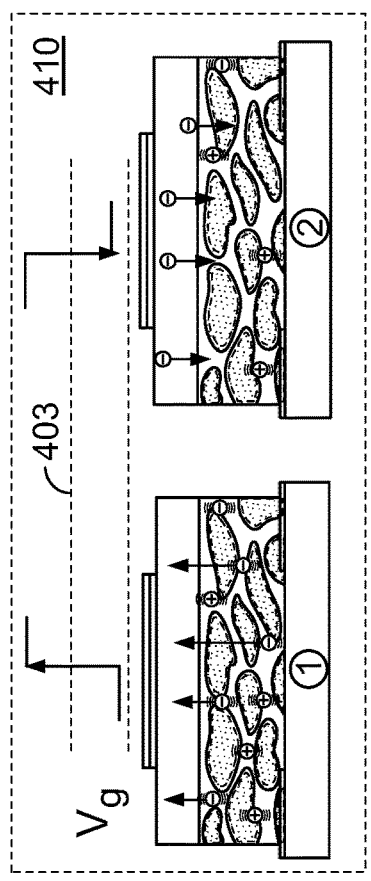
FIGS. 4A and 4B show example schematic diagrams of a d-IGT operating under normal conditions and under high gate voltage conditions, respectively, in accordance with some embodiments of the disclosed subject matter.
Figure 4B:
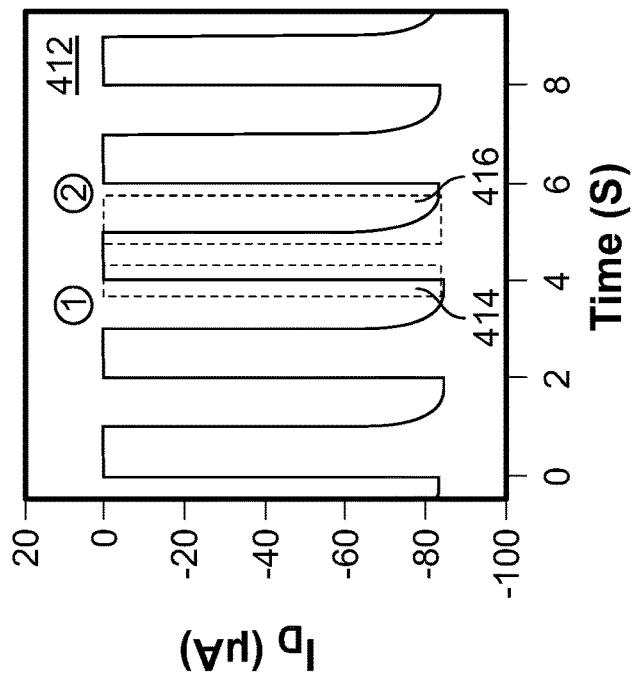
Figure 4A:
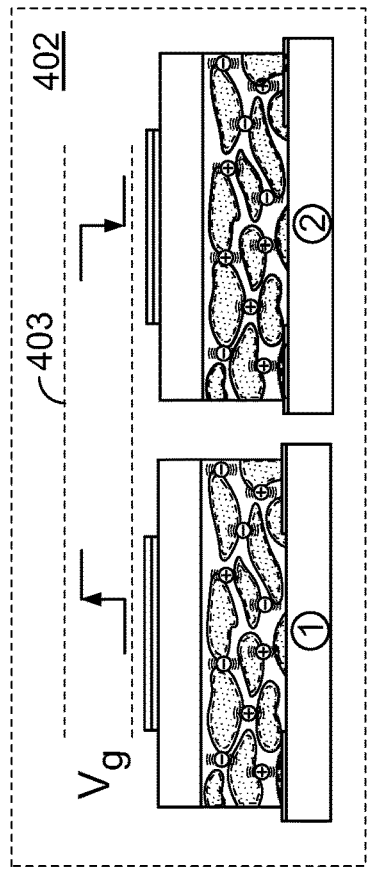
Figure 4A:
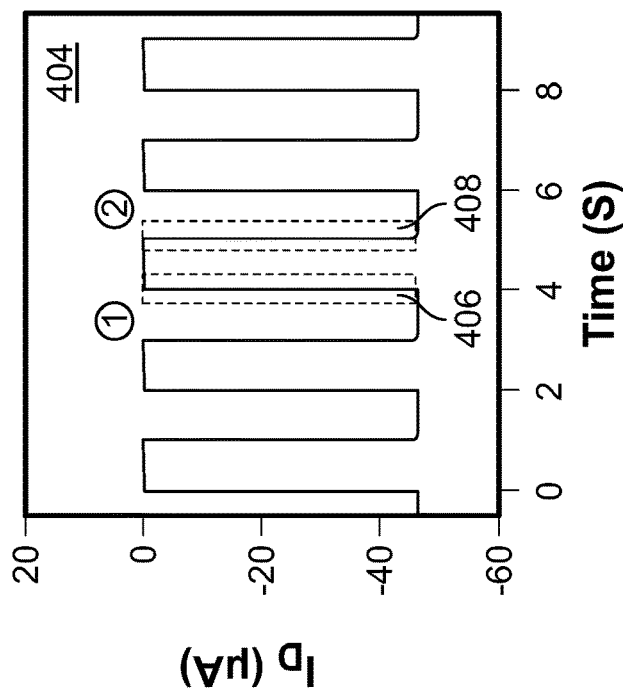

In some embodiments, a conducting polymer of a channel of an IGT can be doped and de-doped repetitively without a decrement in speed or drift in drain current. Turning to FIGS. 4A and 4B, example schematic diagrams and temporal responses of a d-IGT operating under different gate voltage conditions are shown in accordance with some embodiments of the disclosed subject matter.

Referring to FIG. 4A, an example 402 of a schematic diagram of a d-IGT operating under normal device conditions is shown in accordance with some embodiments of the disclosed subject matter. As illustrated in schematic 402, a pulsed gate voltage with an amplitude of $V_G$-0.4V is applied. Note that the amplitude of $V_G$ is below a threshold voltage 403. As shown in schematic 402, mobile ions are maintained in an ion reservoir of a channel of the d-IGT. A temporal response curve 404 shows the drain current $I_D$ in response to the pulsed gate voltage. As illustrated in temporal response curve 404, the drain current has a rise 406 (corresponding to a de-doping of the polymer of the channel of the d-IGT) that is symmetric to a fall 408 of the drain current (corresponding to a doping of the polymer of the channel of the d-IGT).

Turning to FIG. 4B, an example 410 of a schematic diagram of a d-IGT operating with a pulsed gate voltage that exceeds a threshold is shown in accordance with some embodiments of the disclosed subject matter. As illustrated in schematic 410, a pulsed gate voltage with an amplitude of $V_G$-0.9V is applied that exceeds threshold 403, and mobile ions are forced to exit the channel of the d-IGT and enter the ion membrane. A temporal response curve 412 shows the drain current $I_D$ in response to the pulsed gate voltage. As illustrated in temporal response curve 412, the drain current has a rise 414 (corresponding to a de-doping of the polymer of the channel of the d-IGT) with a duration that is shorter than a fall 416 of the drain current (corresponding to a doping of the polymer of the channel of the d-IGT).

Note that, for the temporal response curves shown in FIGS. 4A and 4B, a fixed drain voltage of $V_D$=−0.4V is used.

Turning to FIGS. 5A, 5B, 5C, 5D, 5E, and 5F, an example of a fabrication process for a d-IGT is shown in accordance with some embodiments of the disclosed subject matter.

Figure 5A:
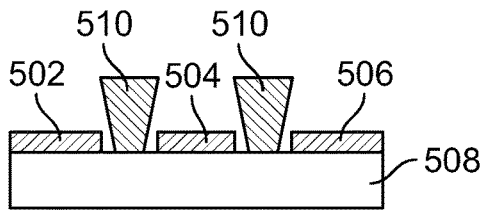
FIGS. 5A, 5B, 5C, 5D, 5E, and 5F show example schematic diagrams for fabrication of a d-IGT in accordance with some embodiments of the disclosed subject matter.

Referring to FIG. 5A, Au electrodes 502, 504, and 506 (e.g., corresponding to a gate electrode, a drain electrode, and a source electrode) and interconnects can be patterned on a substrate 508. In some embodiments, any suitable photolithography and lift-off processes can be used, as described below in more detail.

In some embodiments, the substrate can be made of any suitable material or combination of materials, such as quartz wafers of any suitable thickness (e.g., 1 mm, 1.5 mm, and/or any other suitable thickness) that are coated with a parylene layer of any suitable thickness (e.g., 2 μm, 2.5 μm, and/or any other suitable thickness).

In some embodiments, photoresist 510 can be used for photolithography. In some embodiments, photoresist 510 can be any suitable photoresist, such as a negative photoresist (e.g., AZnLOF2020, and/or any other suitable photoresist). In some embodiments, photoresist 510 can be spin coated (e.g., at 3000 rpm, and/or at any other suitable revolutions per minute), baked on a proximity hot plate at any suitable temperature (e.g., 110° C., 115° C., and/or any other suitable temperature) and for any suitable duration of time (e.g., 90 seconds, 95 seconds, and/or any other suitable duration of time), exposed using any suitable technique(s) (e.g., using a Suss MA6 Mask Aligner, and/or in any other suitable manner), and developed with any suitable developer (e.g., AZ 726 MIF developer, and/or any other suitable developer).

In some embodiments, a Titanium (Ti in the periodic table) adhesion layer of any suitable thickness (e.g., 10 nm, 12 nm, and/or any other suitable thickness) can be deposited, followed by an Au layer of any suitable thickness (e.g., 100 nm, 110 nm, and/or any other suitable thickness). In some embodiments, Ti and Au layers can be deposited with any suitable e-beam metal evaporator.

In some embodiments, the lift-off process can be performed using any suitable technique or combination of techniques, for example, by immersing the substrate in a bath with any suitable stripper (e.g., 1165 stripper, and/or any other suitable stripper).

Figure 5B:
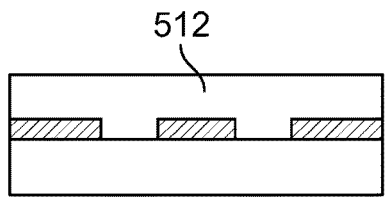

Referring to FIG. 5B, an additional parylene layer 512 can be coated to electrically isolate the Au electrodes. In some embodiments, additional parylene layer 512 can have any suitable thickness (e.g., 2 µm, 2.5 µm, and/or any other suitable thickness). In some embodiments, adhesion of additional parylene layer 512 can be improved in any suitable manner, for example, by using 3-(trimethoxysilyl)propyl methacrylate (A-174 Silane) during coating.

Figure 5C:
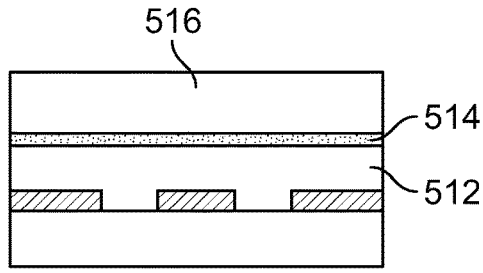

Referring to FIG. 5C, an anti-adhesive layer 514 can be spin-coated on additional parylene layer 512. In some embodiments, anti-adhesive layer 514 can be a dilution of any suitable cleaning solution (e.g., Micro 90, and/or any other suitable solution) at any suitable concentration (e.g., 8% in DI water, and/or any other suitable concentration). In some embodiments, a third sacrificial parylene layer 516 can be deposited on top of anti-adhesive layer 514.

Figure 5D:
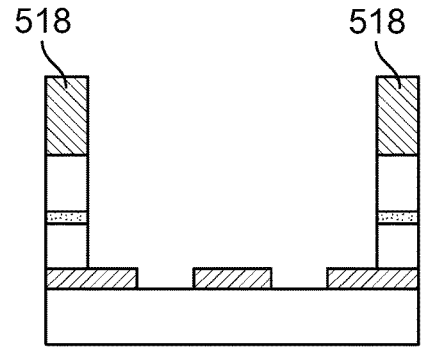

Referring to FIG. 5D, in some embodiments, areas corresponding to a transistor channel and contact pads can be etched via successive photolithography and plasma etching steps. In some embodiments, photolithography can be performed using photoresist 518, such as shown in FIG. 5D. In some embodiments, photoresist 518 can be any suitable positive photoresist (e.g., AZ9260, and/or any other suitable photoresist). In some embodiments, photoresist 518 can be spin-coated (e.g., at 5000 rpm, and/or any other suitable revolutions per minute), baked at any suitable temperature (e.g., 115° C., and/or any other suitable temperature) for any suitable duration of time (e.g., 90 seconds, and/or any other suitable duration), exposed in any suitable manner (e.g., using a Suss MA6 Mask Aligner, and/or in any other suitable manner), and developed using any suitable developer (e.g., AZ400K developer, and/or any other suitable developer) at any suitable concentration (e.g., 1:4 with deionized (DI) water, and/or at any other suitable concentration). In some embodiments, the patterned areas can be etched with any suitable plasma reactive ion etching process.

Figure 5E:
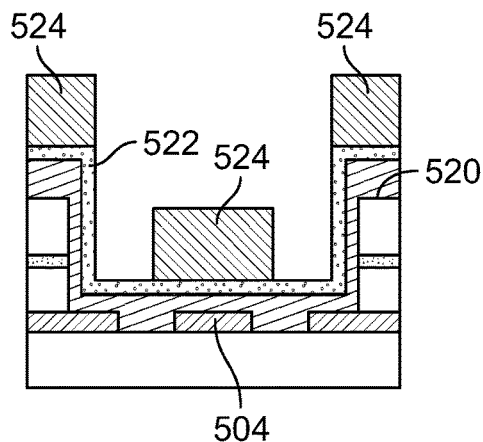

Referring to FIG. 5E, in some embodiments, an ion membrane 520 can be formed. In some embodiments, an ion membrane layer that includes any suitable thickness (e.g., 200 nm, 250 nm, and/or any other suitable thickness) of PEDOT:PSS at any suitable concentration (e.g., with 1%(3-glycidelozypropyl)trimethozysilane (GOPS) as a crosslinker) and chitosan of any suitable thickness (e.g., 700 nm, 750 nm, and/or any other suitable thickness) can be spin coated successively to form the ion membrane that covers gate electrode 504. In some embodiments, the ion membrane can be patterned in any suitable manner. For example, similar to what is described above in connection with FIGS. 5A and 5D, any suitable photolithography (e.g., using photoresist 524) and plasma etching steps can be performed after depositing a protective layer of polymethyl methacrylate (PMMA) 522 of any suitable thickness (e.g., 200 nm, 220 nm, and/or any other suitable thickness).

Figure 5F:
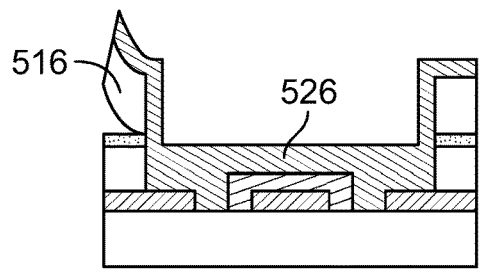

Referring to FIG. 5F, in some embodiments, a channel of the d-IGT can be formed in any suitable manner. For example, in some embodiments, residues of photoresist 524 and PMMA 522 can be rinsed off in any suitable manner (e.g., using acetone, and/or in any other suitable manner), leaving the ion membrane layers intact. Continuing with this example, in some embodiments, a channel 526 can be formed by spin coating any suitable material. For example, as described above in connection with FIG. 1, channel 526 can be formed by spin coating a mixture of PEDOT:PSS with D-sorbitol in any concentration (e.g., 40% D-sorbitol, 1% GOPS as crosslinker, and 0.1% dedecylbenzene sulfonic acid (DBSA) to improve film processing and wettability). In some embodiments, third parylene layer 516 can then be peeled off.

Figure 5G:
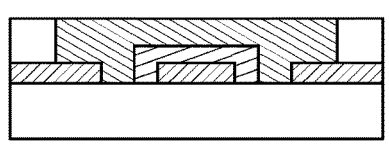
FIGS. 5G and 5H show example schematic diagrams of a d-IGT in accordance with some embodiments of the disclosed subject matter.
Figure 5H:
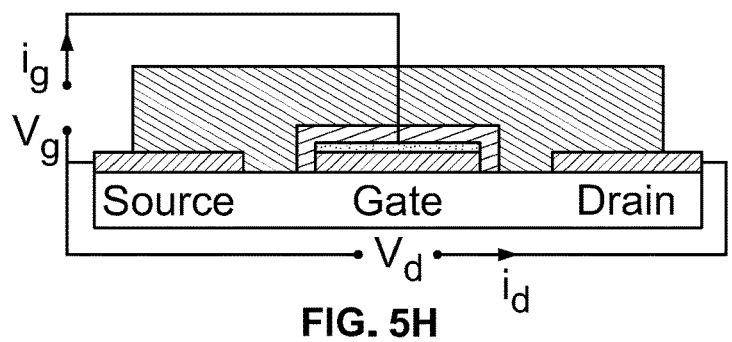

Referring to FIGS. 5G and 5H, example schematic diagrams of a d-IGT fabricated using the steps shown in and described above in connection with FIGS. 5A, 5B, 5C, 5D, 5E, and 5F are shown in accordance with some embodiments of the disclosed subject matter. Note that, unlike d-IGT 100 shown in FIG. 1, the d-IGT shown in FIGS. 5G and 5H, as fabricated using the steps described above in connection with FIGS. 5A, 5B, 5C, 5D, 5E, and 5F has a gate electrode in a bottom position. Note that, in some embodiments, a d-IGT with a gate electrode in a top position (such as shown in and described above in connection with FIG. 1) can have identical electrical characteristics to a d-IGT with a gate electrode in a bottom position (such as shown in FIGS. 5G and 5H).

Figure 6:
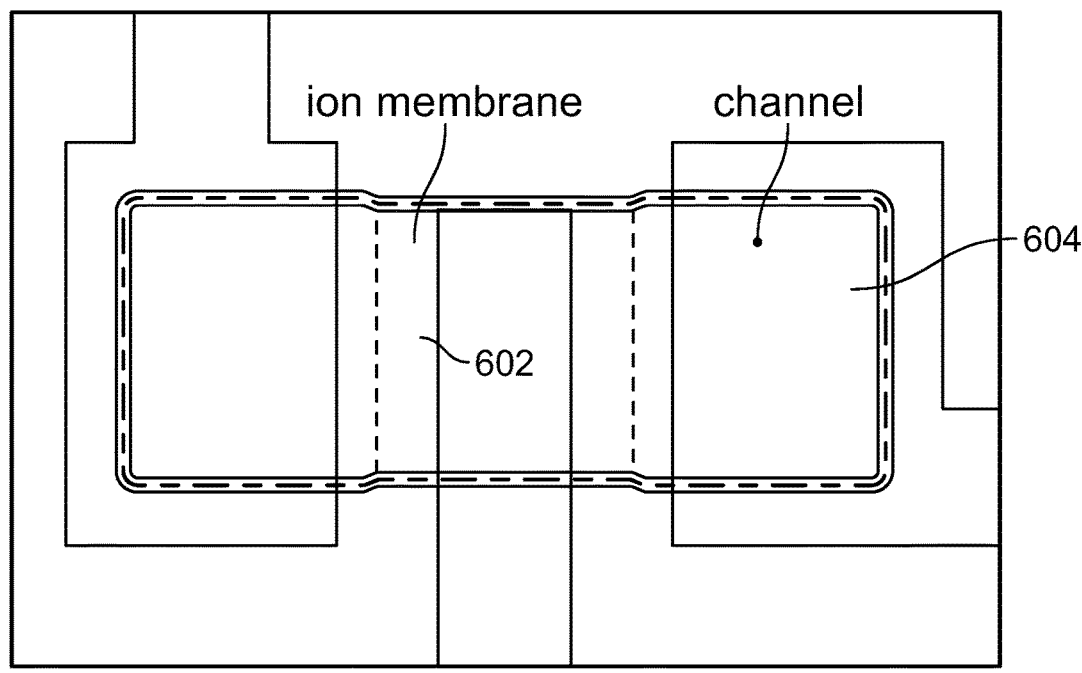
FIG. 6 shows a top view of a d-IGT in accordance with some embodiments of the disclosed subject matter.

Turning to FIG. 6, a top view of a d-IGT fabricated using the steps shown in and described above in connection with FIGS. 5A, 5B, 5C, 5D, 5E, and 5F is shown in accordance with some embodiments of the disclosed subject matter. As illustrated in FIG. 6, the d-IGT can include an ion membrane 602 and a channel 604.

Figure 7:
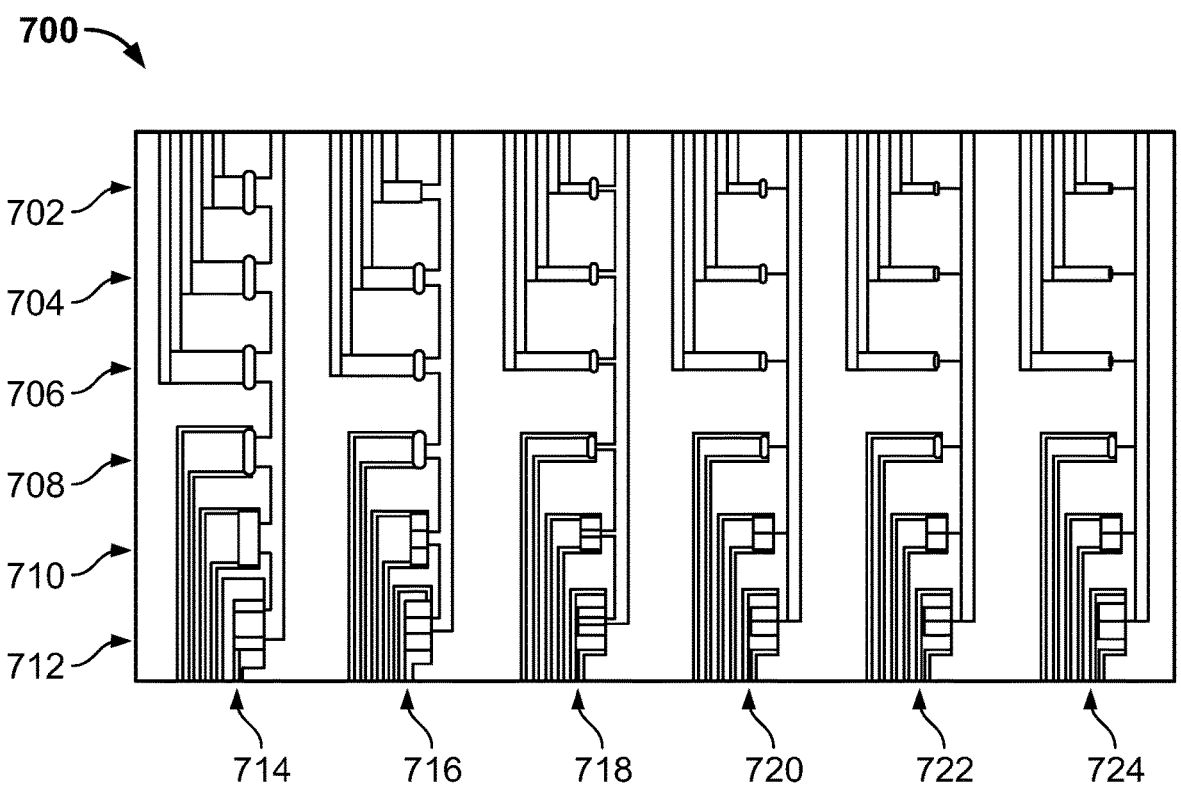
FIG. 7 shows a microfabricated array of internal-ion gated electrochemical transistors (IGTs) for characterizing effects of channel dimensions in accordance with some embodiments of the disclosed subject matter.

Turning to FIG. 7, an example 700 of an array of IGTs that can be used to characterize effects of different channel dimensions is shown in accordance with some embodiments of the disclosed subject matter. In some embodiments, array 700 can include any suitable number of IGTs. For example, as shown in FIG. 7, array 700 can include any suitable rows (e.g., rows 702, 704, 706, 708, 710, and 712) and any suitable columns (e.g., columns 714, 716, 718, 720, 722, and 724), where each row includes IGTs with channels of different widths and where each column includes IGTs with channels of different lengths. Note that, although six rows and six columns are shown in FIG. 7, in some embodiments, any suitable number of IGTs can be included in an array. In some embodiments, an array of IGTs can be created in any suitable manner, for example, by using any suitable microfabrication technique(s).

Figure 8A:
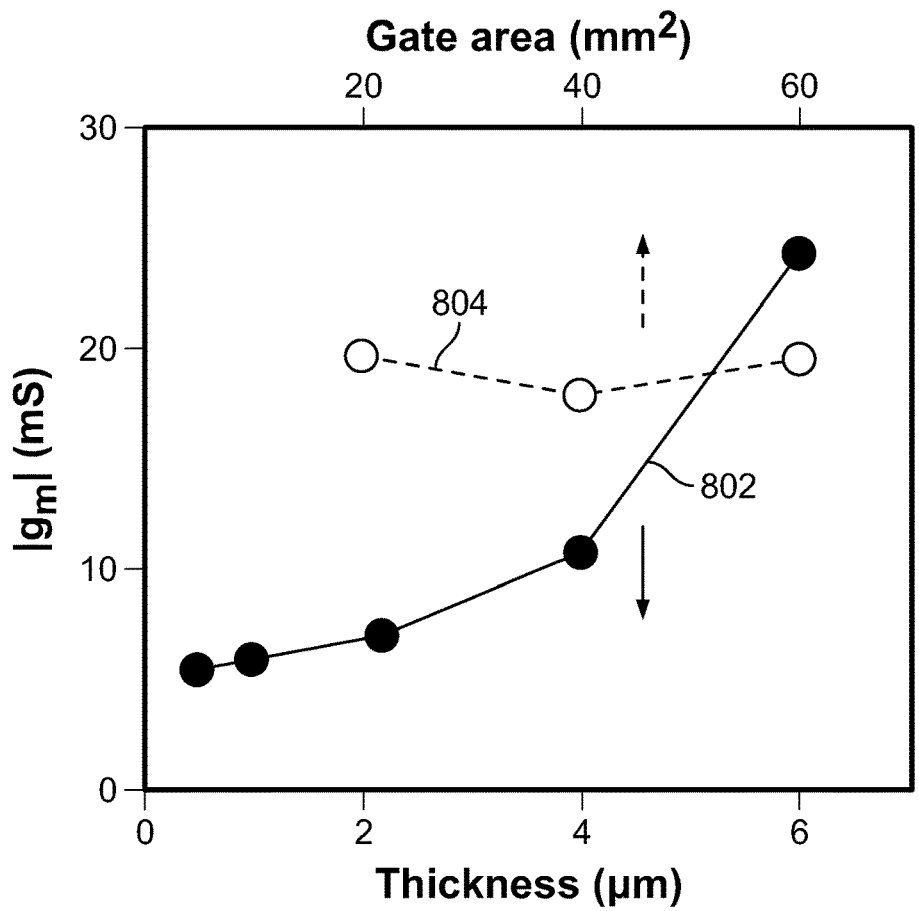
FIGS. 8A, 8B, and 8C show graphs that illustrate effects of dimensions of a d-IGT in accordance with some embodiments of the disclosed subject matter.
Figure 8B:
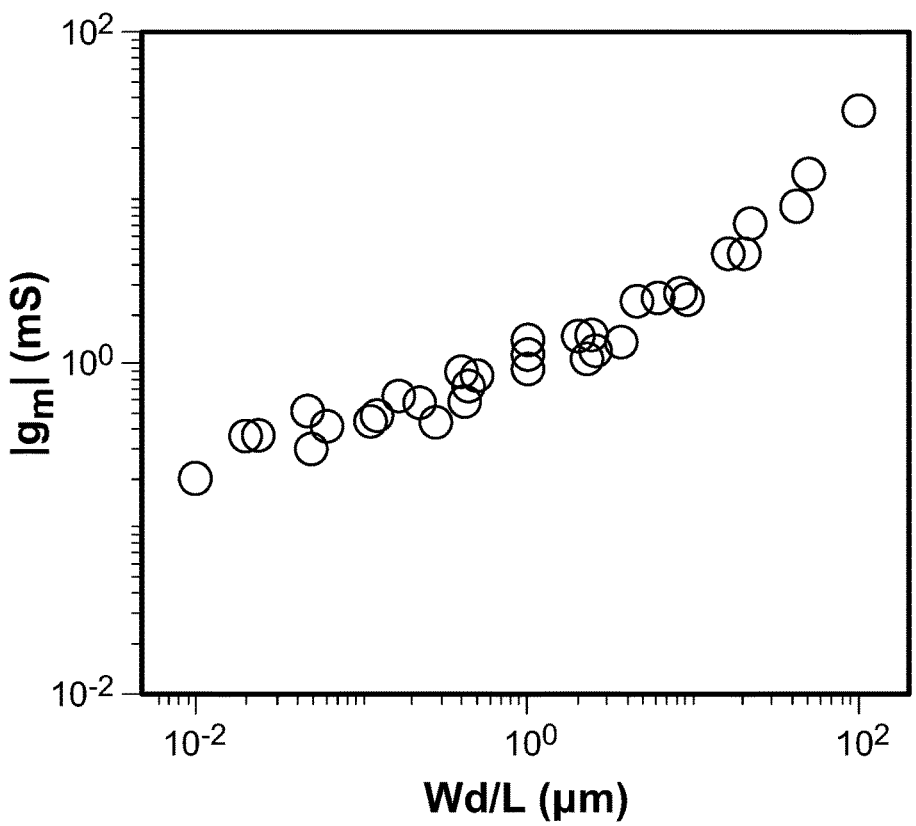
Figure 8C:
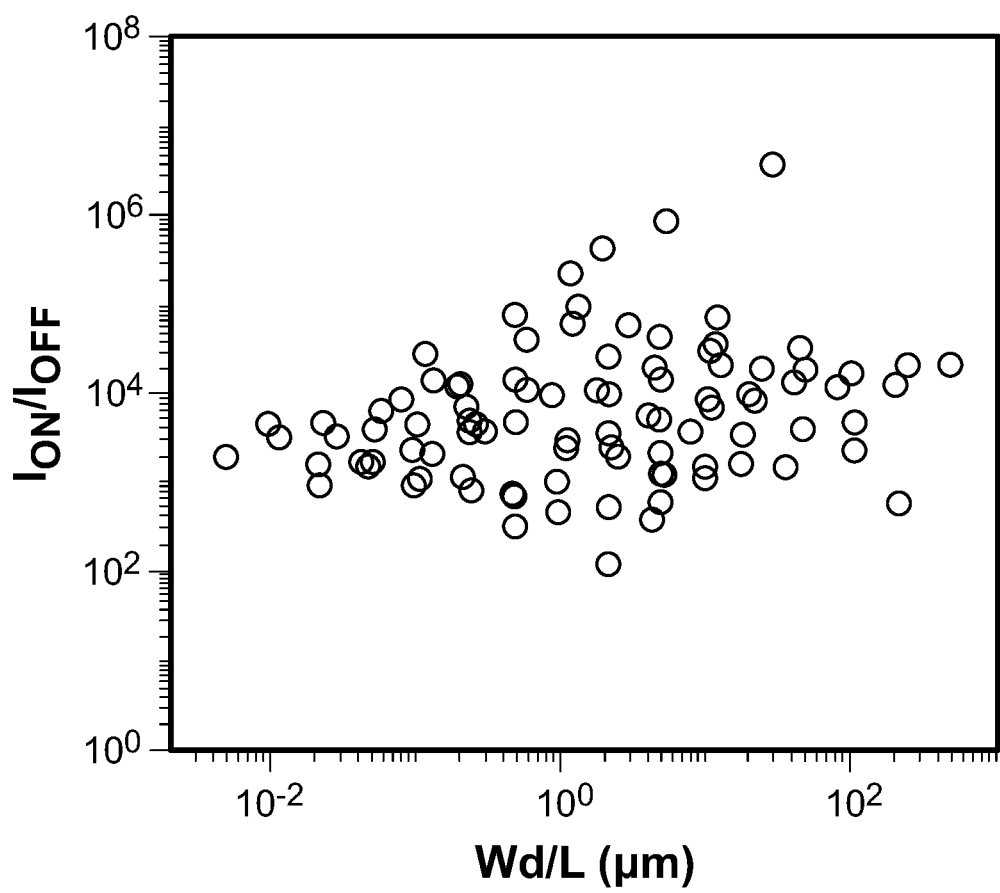

Turning to FIGS. 8A, 8B, and 8C, graphs that show effects of different channel dimensions are shown in accordance with some embodiments of the disclosed subject matter. Note that, in some embodiments, properties of a d-IGTs with different channel dimensions, such as shown in the graphs shown in FIGS. 8A, 8B, and 8C, can be measured using an array of IGTs, such as shown in and described above in connection with FIG. 7.

Referring to FIG. 8A, a curve 802 that shows transconductance of a d-IGT as a function of channel thickness is shown in accordance with some embodiments of the disclosed subject matter. As shown in FIG. 8A, in some embodiments, a d-IGT with a larger channel thickness can have a relatively larger transconductance. Additionally, FIG. 8A includes a curve 804 that shows transconductance as a function of gate electrode area.

Referring to FIG. 8B, a graph that shows transconductance of a d-IGT as a function of channel volume is shown in accordance with some embodiments of the disclosed subject matter. As shown in FIG. 8B, a d-IGT with a larger channel volume can have a relatively larger transconductance.

Referring to FIG. 8C, a graph that shows an On/Off current ratio as a function of channel volume is shown in accordance with some embodiments of the disclosed subject matter. As illustrated, in some embodiments, a d-IGT with a larger channel volume can have a relatively larger $I_{on}/I_{off}$ ratio.

As shown in FIGS. 9A, 9B, 10A, and 10B, in some embodiments, d-IGTs can be combined, for example, to form a logic gate (e.g., as shown in and described below in connection with FIGS. 9A and 9B), to form an amplifier (e.g., as shown in and described below in connection with FIGS. 10A and 10B), and/or for any other suitable purpose.

Figure 9A:
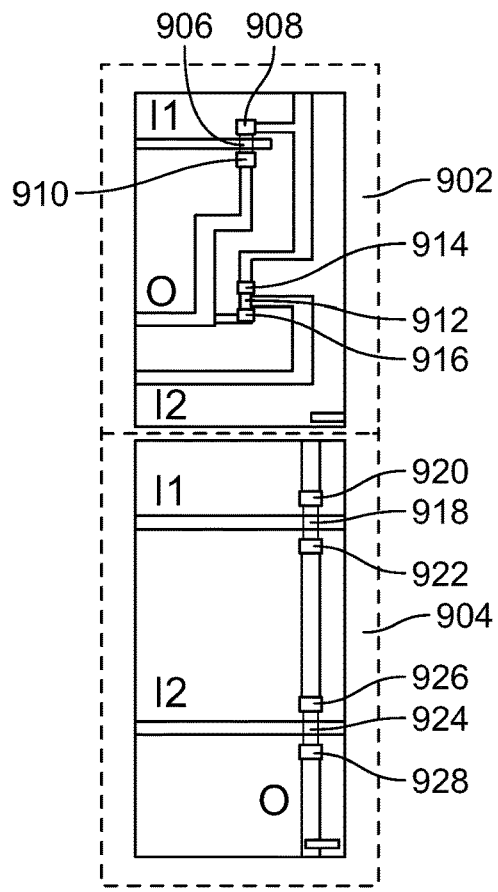
FIGS. 9A and 9B show examples of logic gates created using d-IGTs and temporal responses of the logic gates, respectively, in accordance with some embodiments of the disclosed subject matter.

Turning to FIG. 9A, examples of d-IGT-based logic gates are shown in accordance with some embodiments of the disclosed subject matter. As illustrated, FIG. 9A shows a NOR gate 902 and a NAND gate 904. As shown in FIG. 9A, NOR gate 902 can include a first d-IGT that has a gate electrode 906, a source electrode 908, and a drain electrode 910, and a second d-IGT that has a gate electrode 912, a source electrode 914, and a drain electrode 916. As shown in FIG. 9A, NAND gate 904 can include a first d-IGT that has a gate electrode 918, a source electrode 920, and a drain electrode 922, and a second d-IGT that has a gate electrode 924, a source electrode 926, and a drain electrode 928. In some embodiments, logic gates can be fabricated in any suitable manner, for example, by fabricating d-IGTs on any suitable supports (e.g., parylene-C supports, and/or any other suitable supports) of any suitable thickness (e.g., 2 µm, and/or any other suitable thickness). Note that, in some embodiments, input signals can be applied to the gate electrodes of each d-IGT, as shown in FIG. 9A.

Figure 9B:
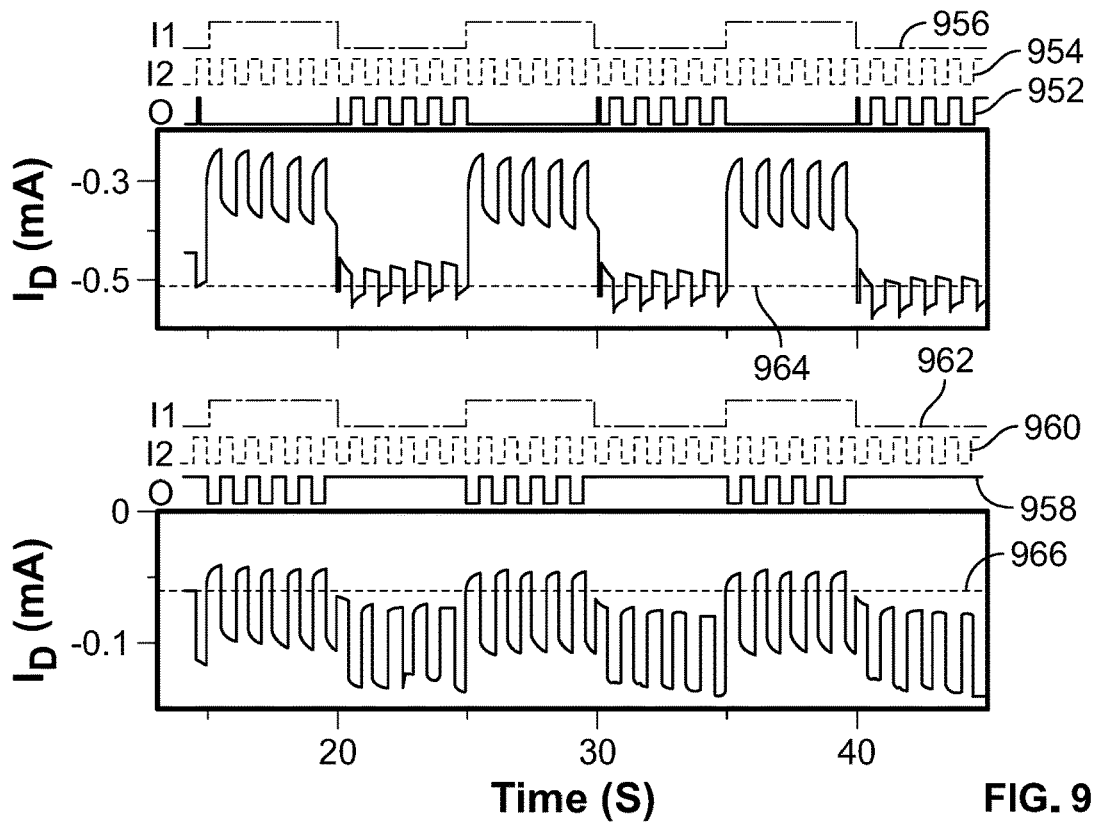

Turning to FIG. 9B, output drain currents of the logic gates shown in FIG. 9A are shown in accordance with some embodiments of the disclosed subject matter. As shown in FIG. 9B, output current 952, present at terminal O of NOR gate 902 of FIG. 9A, is the result of inputs 954 and 956 at terminals I2 and I1, respectively, of NOR gate 902 of FIG. 9A. Output current 958, present at terminal O of NAND gate 904 of FIG. 9A, is the result of inputs 960 and 962 at terminals I2 and I1, respectively, of NAND gate 904 of FIG. 9A. Note that dashed lines 964 and 966 illustrate thresholds for high and low logics, respectively.

Figure 10A:
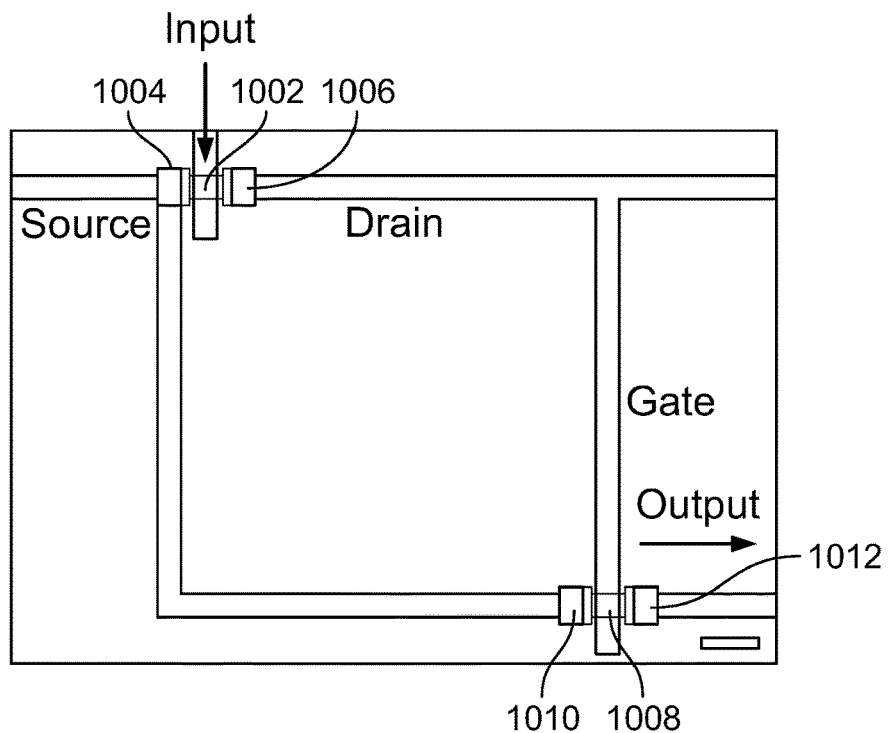
FIGS. 10A and 10B show an example of a cascaded amplifier and output responses of the cascaded amplifier, respectively, in accordance with some embodiments of the disclosed subject matter.

Turning to FIG. 10A, an example of a d-IGT-based cascaded amplifier is shown in accordance with some embodiments of the disclosed subject matter. As shown, the cascaded amplifier can include a first d-IGT that has a gate electrode 1002, a source electrode 1004, and a drain electrode 1006, and can include a second d-IGT that has a gate electrode 1008, a source electrode 1010, and a drain electrode 1012.

Figure 10B:
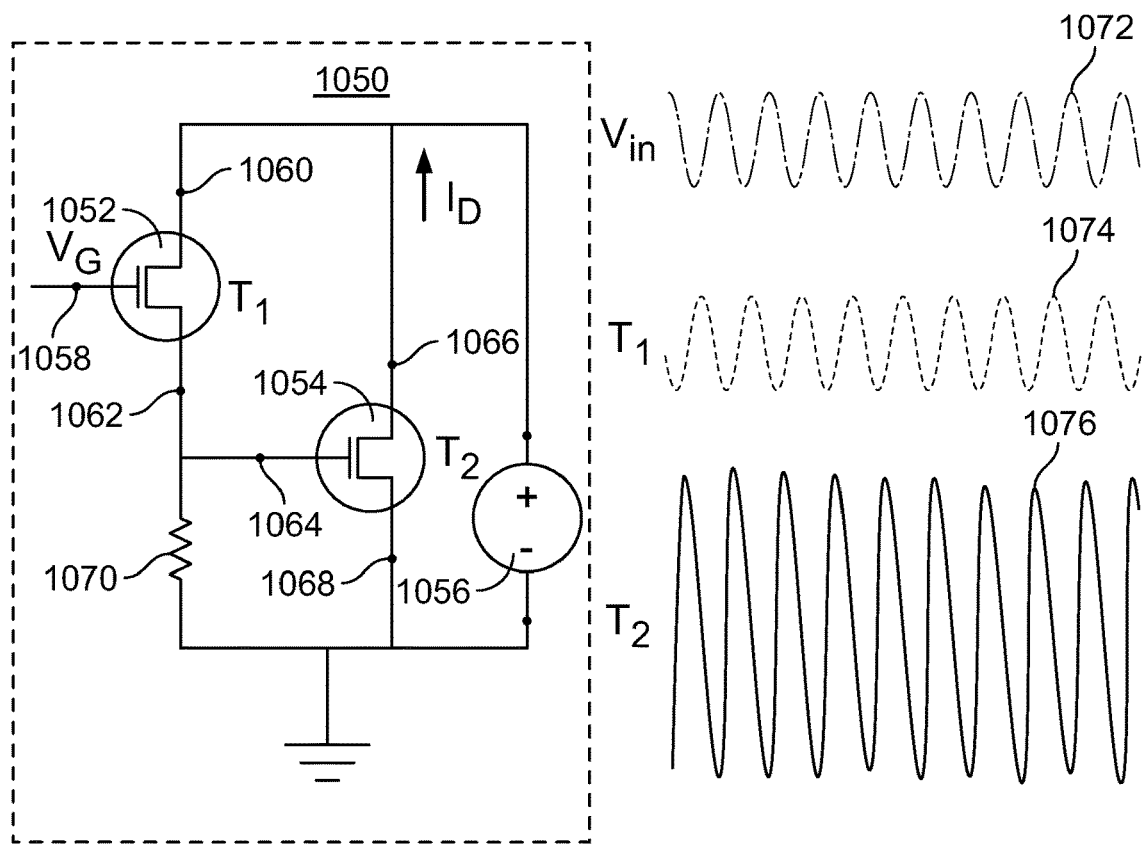

Turning to FIG. 10B, an example circuit diagram 1050 of a d-IGT-based cascaded amplifier is shown in accordance with some embodiments of the disclosed subject matter. As shown in FIG. 10B, in some embodiments, a first d-IGT $T_1$ 1052 (which can have a gate electrode 1058, a source electrode 1060, and a drain electrode 1062) can register the input (shown as $V_G$ in circuit diagram 1050) from gate electrode 1058 of d-IGT $T_1$ 1052 and can amplify the input. In some embodiments, the output current from d-IGT $T_1$ 1052 can then be converted to a voltage using a resistor 1070, and can then be connected to the gate of a second d-IGT $T_2$ 1054 (which can include a gate electrode 1064, a source electrode 1066, and a drain electrode 1068). Continuing further, d-IGT $T_2$ 1054 can produce an amplified output current (shown as $I_D$ in circuit diagram 1050). Note that, in some embodiments, a value of resistor 1070 can control an amplification of the circuit such that a higher resistor value results in a higher gain. In some such embodiments, a higher resistor value can result in an increased output impedance. In some embodiments, any suitable resistor value can be used (e.g., 100Ω, 200Ω, and/or any other suitable value) to optimize a tradeoff between a desired amplification and a desired output impedance. Note that, in some embodiments, any suitable load (not shown) can be connected to d-IGT $T_2$ 1054. In some embodiments, as shown in FIG. 10B, circuit diagram 1050 can additionally include a voltage source 1056 (e.g., a battery, and/or any other suitable voltage source).

FIG. 10B also shows corresponding input and output signals, with an input voltage $V_{in}$ 1072 (corresponding to a gate voltage $V_G$ at d-IGT $T_1$ 1052 as shown in circuit diagram 1050), a current 1074 through d-IGT $T_1$ 1052, and a final amplified current 1076 through d-IGT $T_2$ 1054 (corresponding to current $I_D$ shown in circuit diagram 1050). Note that, the final amplified output from the d-IGT $T_2$ 1054 is shown as a current, which, in some embodiments can be converted to a voltage by connecting a resistor to drain electrode 1068 of d-IGT $T_2$ 1054.

Figure 11A:
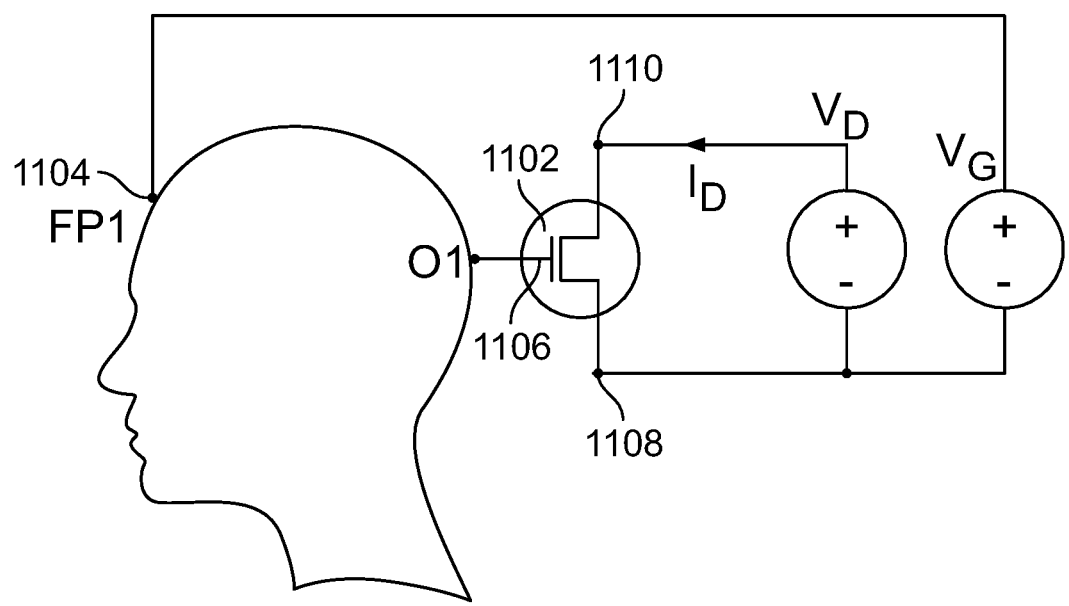
FIG. 11A shows a circuit diagram for using an IGT for recording electroencephalogram (EEG) signals in accordance with some embodiments of the disclosed subject matter.

Turning to FIG. 11A, an example diagram for using a d-IGT for recording EEG signals is shown in accordance with some embodiments of the disclosed subject matter. In some embodiments, any suitable locations can be used for device placement. For example, as shown in FIG. 11A, an IGT 1102 can be placed over an occipital location (O1) and neurophysiological signals can be recorded relative to a reference electrode placed over a left frontopolar location (FP1), as show in FIG. 11A. In some embodiments, IGT 1102 can include a gate electrode 1106, a source electrode 1110, and a drain electrode 1108 such that gate electrode 1106 or an ion membrane corresponding to gate electrode 1106 is placed on the scalp of the subject. In some embodiments, a resistor (not shown) of any suitable resistance (e.g., 500Ω, 1 kΩ, and/or any other suitable value) can be placed in series with the IGT channel (e.g., by placing the resistor in series with a drain terminal of the IGT) to convert a current of IGT 1102 (labeled $I_D$ in FIG. 11A) to a voltage, and the output voltage can be measured with any suitable acquisition system (e.g., an Intan acquisition system, and/or any other suitable system). In some embodiments, $V_D$ and $V_G$ can have any suitable values. For example, in some embodiments, $V_D$=−0.6 V and $V_G$=0.4V. Note that the locations shown in FIG. 11A are merely examples, and, in some embodiments, EEG electrodes can be affixed to any suitable scalp locations. Additionally, note that although the diagram shown in FIG. 11A depicts a configuration for recording EEG signals using only one d-IGT, in some embodiments, any suitable number of IGTs (e.g., two, ten, twenty, one hundred, and/or any other suitable number) can be used. Additionally, note that, in some embodiments, e-IGTs, as shown in and described below in connection with FIG. 12 can be used to record EEG signals.

Note that, in some embodiments, an EEG electrode that uses IGTs can be fabricated in any suitable manner. For example, in some embodiments, any suitable number (e.g., two, three, five, ten, one hundred, two hundred, and/or any other suitable number) of IGTs can be fabricated into any suitable number of conformable ribbon structures that can be placed on the scalp of a subject. Note that, in some embodiments, an IGT used for EEG electrode can adhere to the scalp of the subject in any suitable manner. For example, in some embodiments, an IGT can adhere to a scalp without use of any additional chemicals due to the light weight of the IGT and the flexibility of the conformable ribbon structure. As another example, in some embodiments, sorbitol and/or any other suitable coating can be applied to a gate electrode of each IGT to serve as an intrinsic adhesive. Note that, in some embodiments, a conformable ribbon structure can be constructed with dimensions (e.g., 1.5 mm wide, 1.7 mm wide, and/or any other suitable width) such that the ribbon conforms to the scalp of a subject between hair follicles.

Additionally, note that, in some embodiments, EEG recordings can be obtained using the IGTs in any suitable manner. For example, in some embodiments, any suitable resistor (e.g., a 500Ω resistor, and/or any other suitable resistor) can be placed in series with a channel of the IGT to convert current to voltage. Continuing with this example, in some embodiments, the output voltage can be recorded using any suitable acquisition system. In some embodiments, any suitable frequencies or rhythms can be captured (e.g., alpha bands or oscillations of 8-12 Hz, beta bands or oscillations of 13-25 Hz, and/or any other suitable frequencies or bands). In some embodiments, any suitable processing can be performed on recorded signals, for example, to isolate particular frequencies, remove particular frequencies, and/or any other suitable processing. For example, in some embodiments, an acquired EEG signal can be notch filtered to remove any suitable frequencies. As a more particular example, in some embodiments, an EEG signal can be filtered to remove any frequencies that may be caused by an environmental system (e.g., 55-65 Hz caused by a power system in the United States and other parts of the world that produce noise at 60 Hz, and/or any other suitable frequencies). As another example, in some embodiments, epochs that include blinking or other eye movements can be identified and removed.

In accordance with some embodiments of the disclosed subject matter, an IGT can be fabricated that operates in enhancement mode, such that the IGT is in an OFF state when a positive gate voltage or a gate voltage of $V_G=0V$ is applied, and such that the IGT is in an ON state when a negative gate voltage is applied. Note that an IGT that operates in enhancement mode is referred to herein as an e-IGT. In some embodiments, an e-IGT can have a channel that includes a mixture of PEDOT:PSS, D-sorbitol, polyethylenimine (PEI), and any suitable cross-linking additives, such as described below in connection with FIGS. 12, 15A, and 15B. Similar to d-IGTs as described above, in some embodiments, an e-IGT can have high transconductance, exhibit volumetric capacitance, and can be stably operated over extended periods of time. In some embodiments, the temporal response of an e-IGT can be best described by hole mobility.

Figure 12:
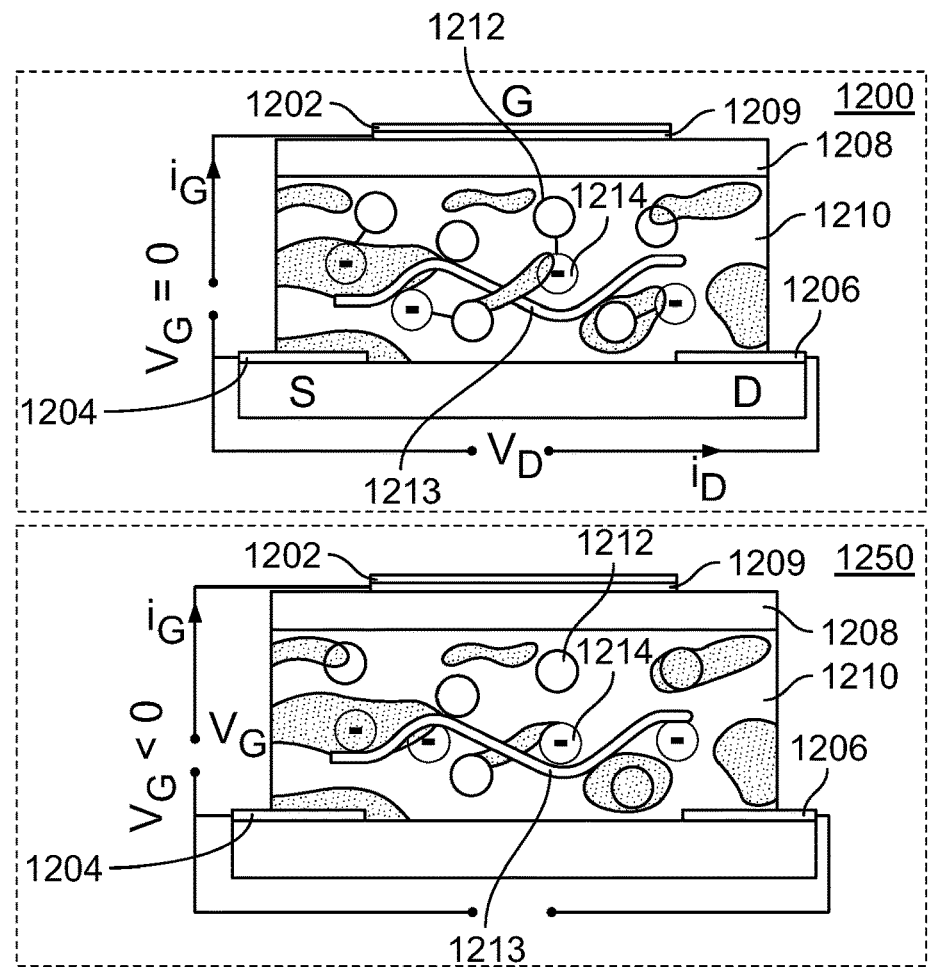
FIG. 12 shows schematic diagrams for an enhancement mode internal-ion gated electrochemical transistor (e-IGT) in accordance with some embodiments of the disclosed subject matter.

Turning to FIG. 12, an example 1200 of a schematic of an e-IGT with an applied gate voltage of $V_G=0V$ and an example 1250 of a schematic of an e-IGT with an applied gate voltage of $V_G<0V$ is shown is shown in accordance with some embodiments of the disclosed subject matter. As illustrated in FIG. 12, an e-IGT can include a gate electrode 1202, a source electrode 1204, and a drain electrode 1206. Additionally, as shown in FIG. 12, an e-IGT can include an ion membrane 1208 and a channel 1210.

Similar to what was described above in connection with a d-IGT, gate electrode 1202, source electrode 1204, and drain electrode 1206 can each be made of any suitable material, such as Au, and/or any other suitable material.

Similar to what was described above in connection with FIG. 1, an e-IGT can include an ion membrane 1208 that can be between gate electrode 1202 and channel 1210. In some embodiments, ion membrane 1208 can allow gate electrode 1202 to have efficient ionic, but not electronic, conduction with the bulk of channel 1210. In some embodiments, ion membrane 1208 can be made of any suitable material. For example, in some embodiments, ion membrane 1208 can be made of any suitable biocompatible and stable material, such as chitosan. In some embodiments, any other suitable biopolymer can be used for ion membrane 1208, such as gelatin, PVA, PVA:PSS, and/or any other suitable biopolymer. Note that, in some embodiments, to reduce an electrochemical impedance between gate electrode 1202 and ion membrane 1208, a layer of a conducting polymer (e.g., PEDOT:PSS) can be deposited onto gate electrode 1202, as shown by layer 1209 of FIG. 12.

In some embodiments, channel 1210 can include any suitable material or combination of materials. For example, as shown in FIG. 12, channel 1210 can include a combination of PEDOT:PSS, PEI, D-sorbitol, and/or any other suitable combination of materials. In some embodiments, D-sorbitol in channel 1210 can enhance electronic conductivity of the PEDOT:PSS film. Additionally, in some embodiments, D-sorbitol can facilitate maintenance and movement of mobile ions within channel 1210 by forming a hydrated ion reservoir. In some embodiments, amine groups of PEI can serve as reducing agent through electron transfer to PEDOT:PSS and can decrease the intrinsic conductivity of channel 1210 by several orders of magnitude.

Referring to schematic 1200 of FIG. 12, during an OFF state of the e-IGT (i.e., when $V_G=0$ V, as shown in FIG. 12, or when a positive gate voltage is applied), protonated $PEI^+$ 1212 can bond ionically with $PSS^-$ 1214 to maintain charge balance. Note that, in the OFF state of the e-IGT, PEDOT 1213 can be in its reduced state ($PEDOT^0$). In some embodiments, the bonding of $PEI^+$ 1212 to $PSS^-$ 1214 can be facilitated by the presence of sulfonic acid groups in PSS and the basic nature of PEI.

Referring to schematic 1250 of FIG. 12, in some embodiments, during an ON state of the e-IGT, a negative applied gate voltage (i.e., $V_G<0$ V) can compensate $PEI^+$ 1212 in channel 1210, causing the bonded $PSS^-$ 1214 to be released. In some embodiments, $PSS^-$ 1214 can then recombine with PEDOT 1213, as shown in schematic 1250 of FIG. 12. In some embodiments, the formation of $PEDOT^+:PSS^-$ can increase the conductivity of channel 1210, thereby allowing the gate voltage to modulate the channel current. In some embodiments, the hydrated reservoirs established by D-sorbitol within the channel facilitate these ion exchanges by maintaining channel hydration within the e-IGT and facilitating ion mobility within channel 1210.

Figure 13:
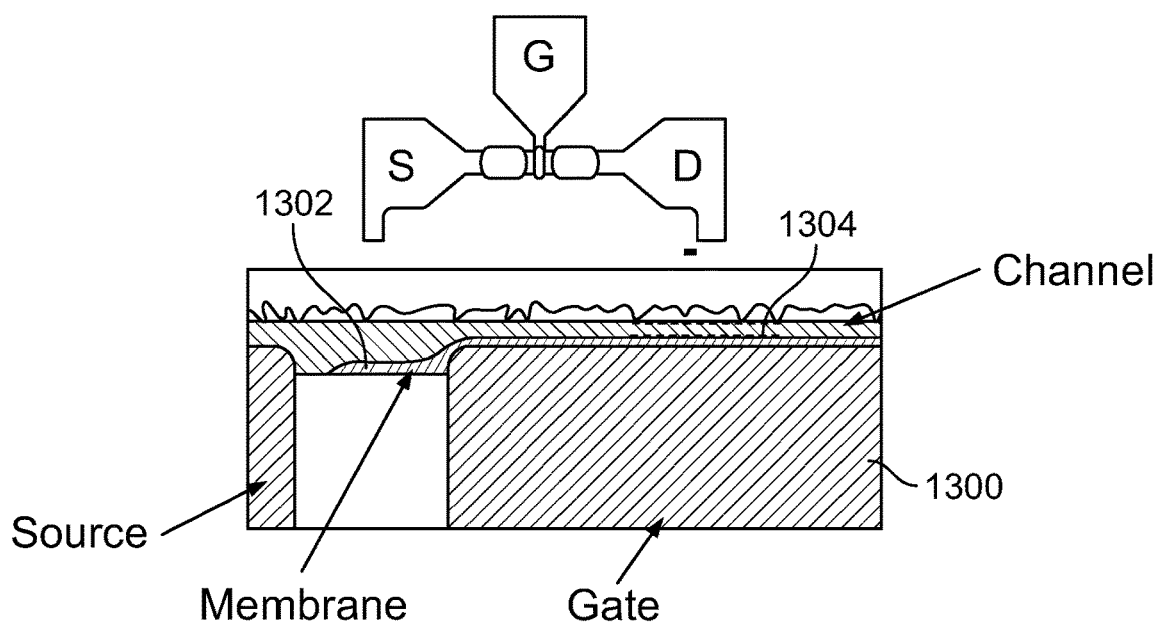
FIG. 13 shows a top view of an e-IGT in accordance with some embodiments of the disclosed subject matter.

Turning to FIG. 13, a top view 1300 of an e-IGT is shown in accordance with some embodiments of the disclosed subject matter. As illustrated in FIG. 13, the e-IGT includes an ion membrane 1302 and a channel 1304. Note that the channel of the e-IGT shown in FIG. 13 has a length of 12 μm, a width of 12 μm, and a channel thickness of 1.9 μm.

Figure 14A:
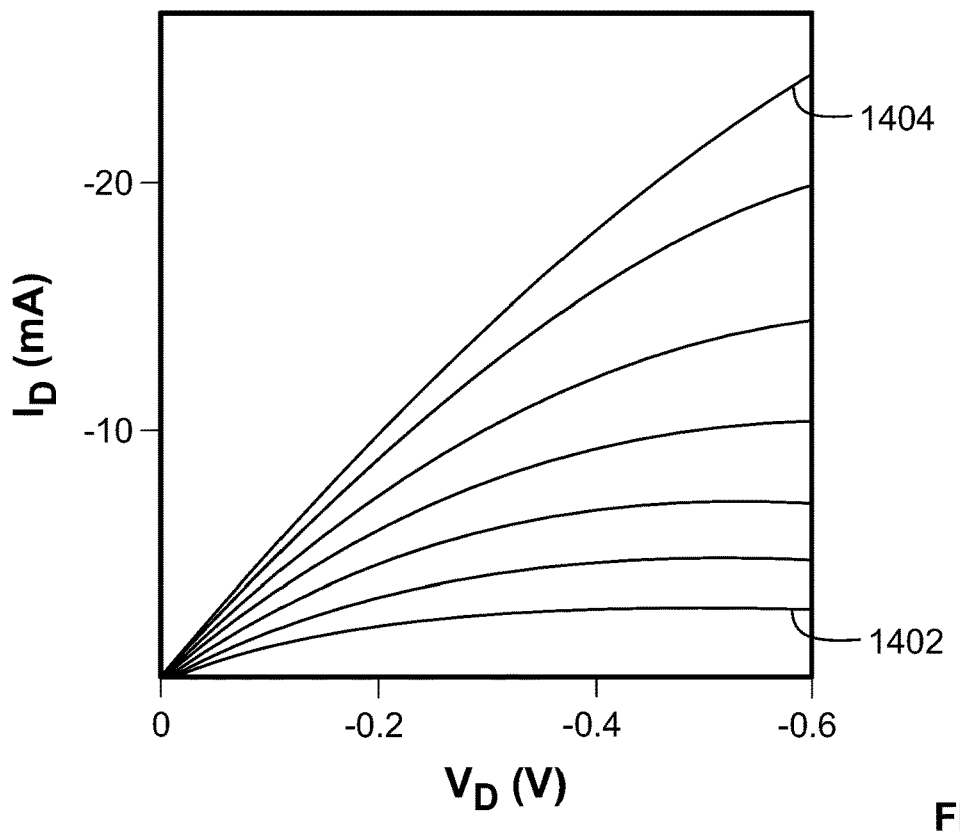
FIGS. 14A and 14B show output characteristics of an e-IGT in accordance with some embodiments of the disclosed subject matter.

Turning to FIG. 14A, output characteristics ($I_D$-$V_D$) of an e-IGT are shown in accordance with some embodiments of the disclosed subject matter. FIG. 14A includes multiple $I_D$-$V_D$ curves, each corresponding to a different gate voltage, $V_G$. For example, FIG. 14A includes a curve 1402 corresponding to a gate voltage of $V_G=0V$, and a curve 1404 corresponding to a gate voltage of $V_G=-0.6V$.

Figure 14B:
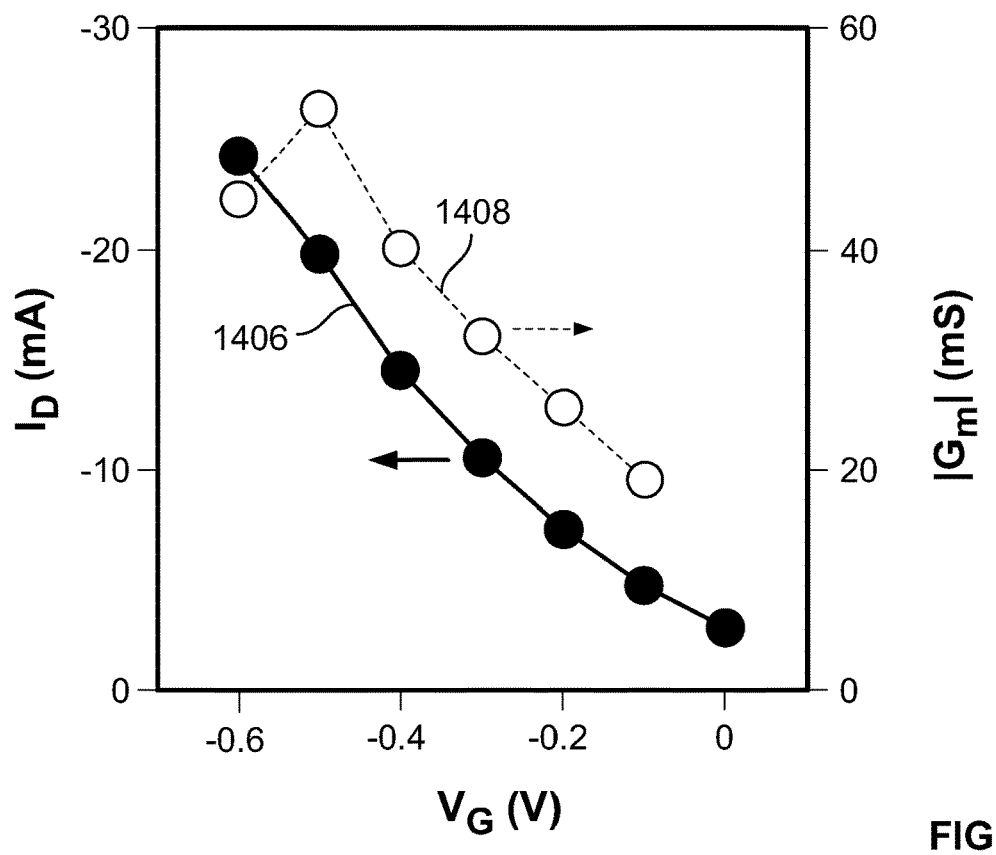

Turning to FIG. 14B, a transfer curve 1406 of an e-IGT and a corresponding transconductance curve 1408 for a drain voltage of $V_D=-0.6V$ is shown in accordance with some embodiments of the disclosed subject matter.

Note that the $I_D$-$V_D$ curves shown in FIG. 14A, the transfer curve shown in FIG. 14B, and the transconductance curve shown in FIG. 14B were measured using an e-IGT with a channel length of 5 µm, a width of 500 µm, and a PEDOT:PSS thickness of 300 nm. In some embodiments, an e-IGT with different channel dimensions can have different characteristics, such as shown in and described below in connection with FIGS. 16A, 16B, 16C, and 16D.

Figure 15A:
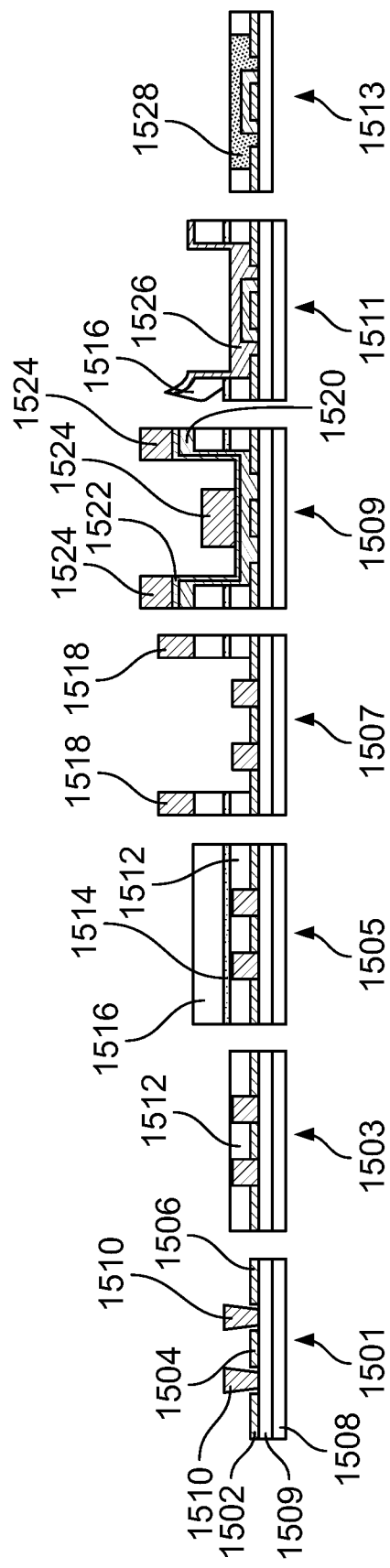
FIGS. 15A and 15B show processes for fabricating an e-IGT in accordance with some embodiments of the disclosed subject matter.
Figure 15B:
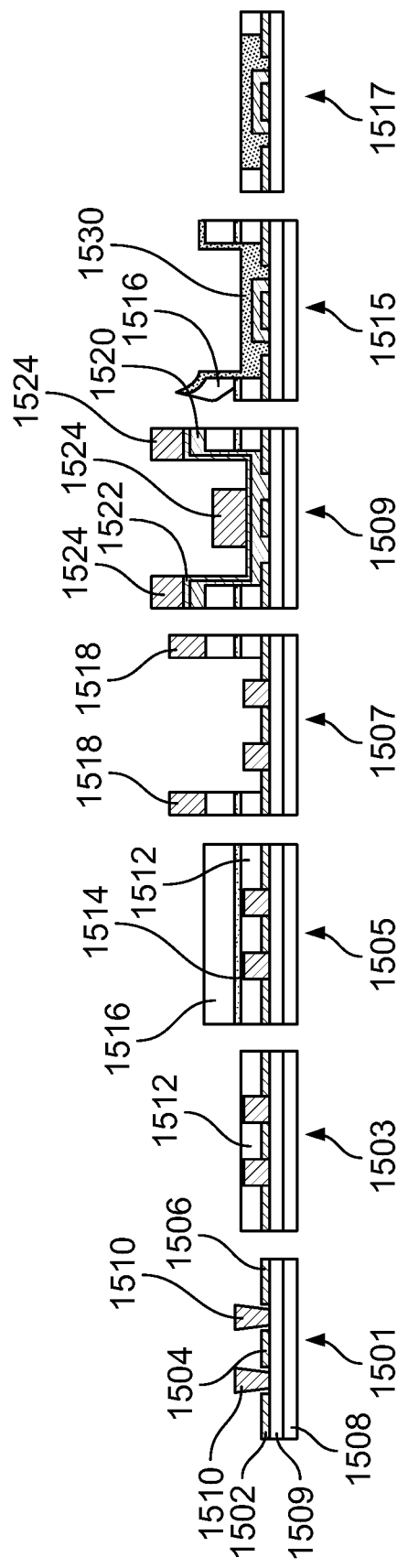

Turning to FIGS. 15A and 15B, schematic diagrams that show steps for fabrication of an e-IGT are shown in accordance with some embodiments of the disclosed subject matter. Note that FIG. 15A illustrates a process in which an e-IGT is fabricated using layer-by-layer deposition of PEDOT:PSS and PEI, and that FIG. 15B illustrates an alternative process in which an e-IGT is fabricated using a solution-based PEDOT:PSS-PEI.

At 1501, Au electrodes 1502, 1504, and 1506 (e.g., corresponding to a gate electrode, a drain electrode, and a source electrode) and interconnects can be patterned on a substrate 1508. In some embodiments, any suitable photolithography and lift-off processes can be used.

In some embodiments, substrate 1508 can be made of any suitable material or combination of materials, such as quartz wafers of any suitable thickness (e.g., 1 mm, 1.5 mm, and/or any other suitable thickness) that are coated with a parylene layer 1509 of any suitable thickness (e.g., 1 µm, 1.2 µm, 2 µm, 2.5 µm, and/or any other suitable thickness).

In some embodiments, a photoresist 1510 can be used for photolithography. In some embodiments, photoresist 1510 can be any suitable photoresist, such as a negative photoresist (e.g., AZnLOF2020, and/or any other suitable photoresist). In some embodiments, photoresist 1510 can be spin coated (e.g., at 3000 rpm, and/or at any other suitable revolutions per minute), baked on a proximity hot plate at any suitable temperature (e.g., 105° C., 110° C., and/or any other suitable temperature) and for any suitable duration of time (e.g., 90 seconds, 95 seconds, and/or any other suitable duration of time), exposed using any suitable technique(s) (e.g., using a Suss MA6 Mask Aligner, and/or in any other suitable manner), and developed with any suitable developer (e.g., AZ 300 MIF developer, and/or any other suitable developer).

In some embodiments, a Ti adhesion layer of any suitable thickness (e.g., 10 nm, 12 nm, and/or any other suitable thickness) can be deposited, followed by an Au layer of any suitable thickness (e.g., 150 nm, 160 nm, and/or any other suitable thickness). In some embodiments, the Ti layer and the Au layer can be deposited in any suitable manner (e.g., an Angstrom EvoVac Multi-Process, and/or any other suitable process) and can be patterned in any suitable manner (e.g., by soaking the substrate in a bath of resist remover, and/or in any other suitable manner).

Referring to 1503, an additional parylene layer 1512 can be coated to electrically isolate the Au electrodes. In some embodiments, additional parylene layer 1512 can have any suitable thickness (e.g., 2 µm, 2.5 µm, and/or any other suitable thickness). In some embodiments, adhesion of additional parylene layer 512 can be improved in any suitable manner, for example, by using 3-(trimethoxysilyl)propyl methacrylate (A-174 Silane) during chemical vapor deposition.

Referring to 1505, an anti-adhesive layer 1514 can be spin-coated on additional parylene layer 1512. In some embodiments, anti-adhesive layer 1514 can be a dilution of any suitable cleaning solution (e.g., Micro 90, and/or any other suitable solution) at any suitable concentration (e.g., 8% in DI water, and/or any other suitable concentration). In some embodiments, a third sacrificial parylene layer 1516 can be deposited on top of anti-adhesive layer 1514.

Referring to 1507, in some embodiments, areas corresponding to a transistor channel and contact pads can be etched via successive photolithography and plasma etching steps. In some embodiments, photolithography can be performed using photoresist 1518, as shown in FIGS. 15A and 15B. In some embodiments, photolithography can be performed in any suitable manner and using any suitable technique(s). For example, in some embodiments, any suitable positive photoresist (e.g., AZ9260, and/or any other suitable photoresist) can be spin-coated (e.g., at 5000 rpm, and/or any other suitable revolutions per minute), baked at any suitable temperature (e.g., 115° C., 120° C., and/or any other suitable temperature) for any suitable duration of time (e.g., 90 seconds, 95 seconds, and/or any other suitable duration of time), exposed in any suitable manner (e.g., using a Suss MA6 Mask Aligner, and/or in any other suitable manner), and developed using any suitable developer (e.g., AZ400K developer, and/or any other suitable developer) at any suitable concentration (e.g., 1:4 with DI water, and/or at any other suitable concentration). In some embodiments, the patterned areas can be etched with any suitable plasma reactive ion etching process. In some embodiments, to prevent the first layer of parylene from being over-etched, an extra layer of a photoresist (e.g., AZnLOF202, and/or any other suitable photoresist) can be spin-coated between the metal layer and the silane-treated parylene.

Referring to 1509, in some embodiments, an ion membrane 1520 can be formed. In some embodiments, an ion membrane layer that includes any suitable thickness (e.g., 200 nm, 250 nm, and/or any other suitable thickness) of PEDOT:PSS at any suitable concentration (e.g., 1% GOPS) and chitosan of any suitable thickness (e.g., 700 nm, 750 nm, and/or any other suitable thickness) can be spin coated successively to form the ion membrane that covers gate electrode 1504. In some embodiments, the ion membrane can be patterned in any suitable manner. For example, in some embodiments, any suitable photolithography (e.g., using photoresist 1524) and plasma etching steps can be performed after depositing a protective layer of PMMA 1522 of any suitable thickness.

As described above, in some embodiments, a channel of the e-IGT can be formed using layer-by-layer deposition of PEDOT:PSS, as shown in FIG. 15A. At 1511, in some such embodiments, residues of photoresist 1524 and PMMA 1522 can be rinsed off in any suitable manner (e.g., using acetone, and/or in any other suitable manner), leaving the ion membrane layers intact. Continuing with this example, in some embodiments, a channel 1526 can be formed by spin coating any suitable material. For example, as described above in connection with FIG. 1, channel 1526 can be formed by spin coating a mixture of PEDOT:PSS with D-sorbitol at any suitable concentration (e.g., 40% D-sorbitol, 1% GOPS as a crosslinker, 0.1% DBSA, to improve film processing and wettability). In some embodiments, third parylene layer 1516 can then be peeled off. Continuing to 1513, in some embodiments, the PEDOT:PSS can then be coated with a PEI layer 1528, yielding the e-IGT shown at 1513 of FIG. 15A.

Alternatively, in some embodiments, a channel of the e-IGT can be formed using a solution-based PEDOT:PSS-PEI. Referring to FIG. 15B, at 1515, residues of photoresist 1524 and PMMA 1522 can be rinsed off in any suitable manner (e.g., using acetone, and/or in any other suitable manner), leaving the ion membrane layers intact. Continuing with this example, in some embodiments, a channel 1530 can be formed by coating a PEDOT:PSS-PEI solution. In some embodiments, third parylene layer 1516 can then be peeled off, yielding the e-IGT shown at 1517 of FIG. 15B.

In some embodiments, modifying characteristics of an e-IGT (e.g., characteristics of a channel of an e-IGT, characteristics of a gate electrode of an e-IGT, and/or any other suitable characteristics) can change performance characteristics of the e-IGT, such as a transconductance of the e-IGT. FIGS. 16A, 16B, 16C, and 16D show example graphs that illustrate effects of different e-IGT parameters on e-IGT transconductance in accordance with some embodiments of the disclosed subject matter. In some embodiments, the relationships between e-IGT characteristics and e-IGT transconductance shown in FIGS. 16A, 16B, 16C, and 16D can be used to fabricate an e-IGT with a particular transconductance, for example, to generate an e-IGT capable of a particular level of amplification. Note that, for all graphs shown in FIGS. 16A, 16B, 16C, and 16D, transconductance was calculated from a transfer curve for a drain voltage $V_D = -0.6V$ and with a gate voltage $V_G$ varying from 0V to $-0.6V$.

Figure 16A:
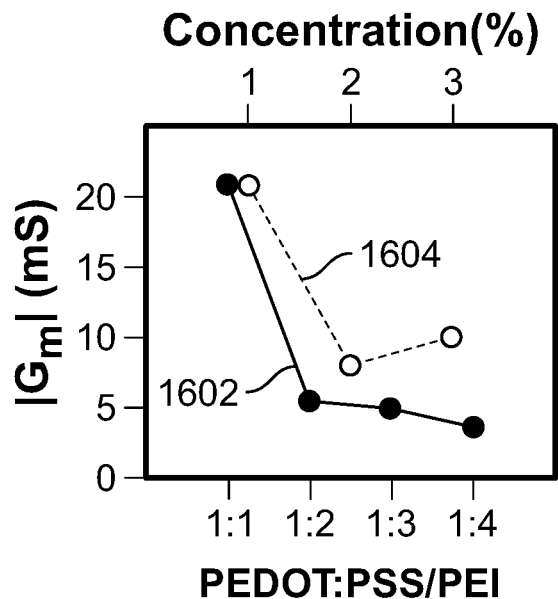
FIGS. 16A, 16B, 16C, and 16D show graphs that illustrate the effects of varying parameters of an e-IGT in accordance with some embodiments of the disclosed subject matter.

Turning to FIG. 16A, a graph 1602 illustrates a relationship between a ratio of PEDOT:PSS to PEI in a channel of an e-IGT on transconductance of the e-IGT. Additionally, FIG. 16A shows a graph 1604 that illustrates a relationship between a concentration of PEI used in a channel of an e-IGT on transconductance of the e-IGT.

Figure 16B:
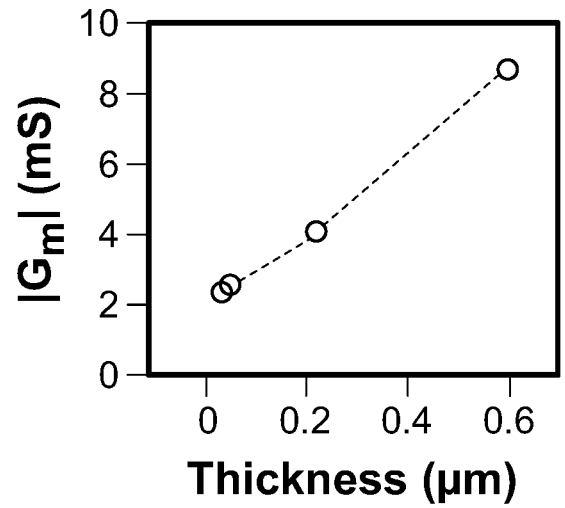

Turning to FIG. 16B, a graph that illustrates a relationship between a thickness of a channel of an e-IGT on transconductance is shown in accordance with some embodiments of the disclosed subject matter.

Figure 16C:
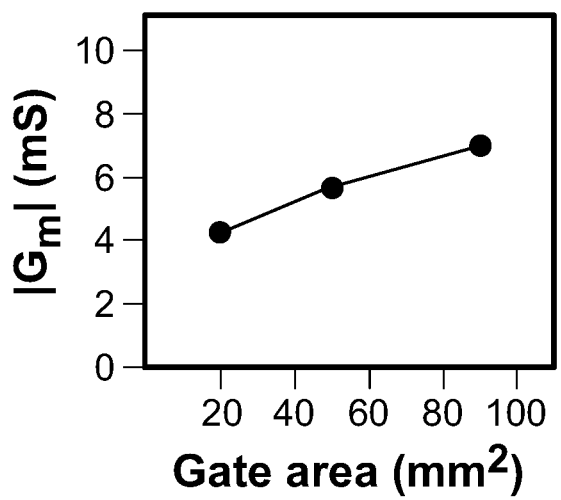

Turning to FIG. 16C, a graph that illustrates a relationship between an area of a gate electrode of an e-IGT on transconductance is shown in accordance with some embodiments of the disclosed subject matter.

Figure 16D:
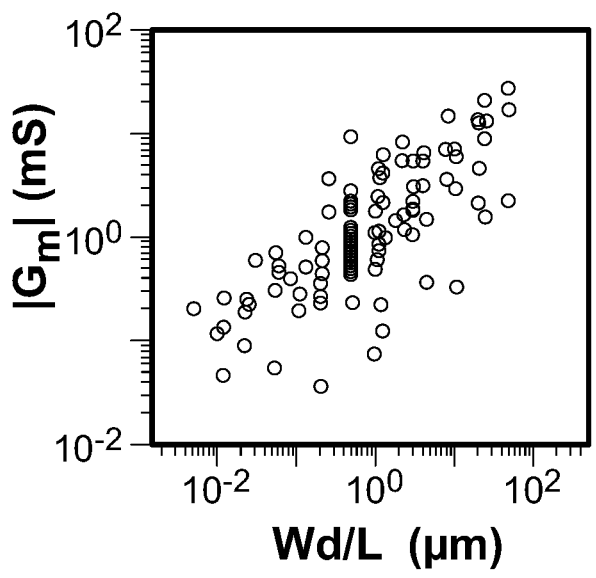

Turning to FIG. 16D, a graph that illustrates a relationship between a volume of a channel of an e-IGT on transconductance is shown in accordance with some embodiments of the disclosed subject matter. Note that, in some embodiments, operating characteristics of e-IGTs with different channel dimensions can be measured in any suitable manner. For example, similar to what is shown in and described above in connection with FIG. 7, an array of any suitable number of e-IGTs can be microfabricated, each having different channel dimensions.

In some embodiments, e-IGTs can be used to fabricate digital logic gates, for example, for use in integrated circuits. Note that, due to the low current and high resistance of an e-IGT in an unbiased, OFF state, there can be high resistance paths between adjacent e-IGTs without any channel patterning. Conversely, depletion mode transistors, such as the d-IGTs shown in and described above in connection with FIG. 1, may have high conductivity in a channel in an unbiased OFF state, which may necessitate complex patterning processes to prevent cross-talk and current leakage between adjacent depletion mode transistors on an integrated circuit.

Figure 17:
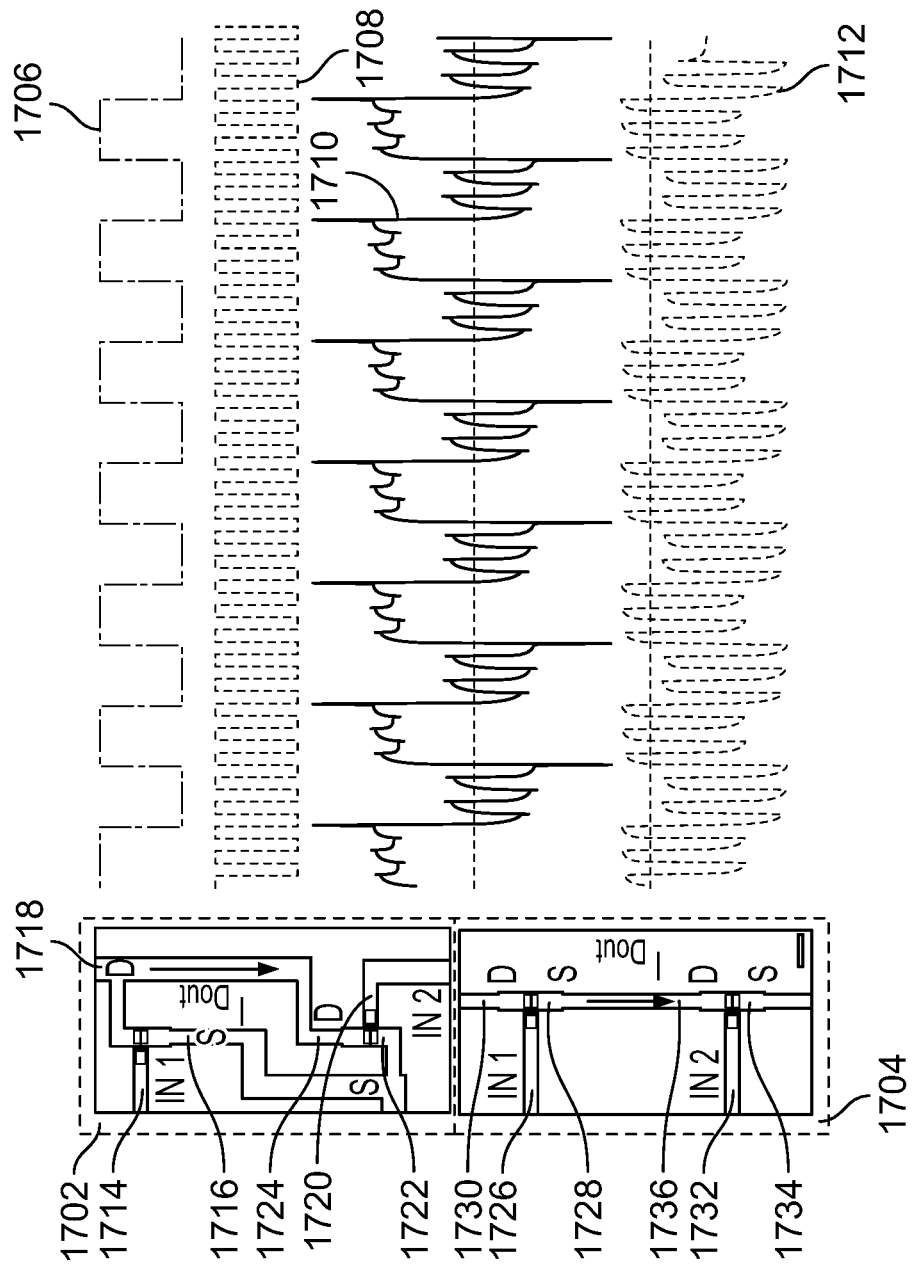
FIG. 17 shows a schematic diagram of logic gates created using e-IGTs and resulting output waveforms of the logic gates in accordance with some embodiments of the disclosed subject matter.

Turning to FIG. 17, examples of an OR gate 1702 and an AND gate 1704 fabricated using e-IGTs are shown in accordance with some embodiments of the disclosed subject matter. As shown in FIG. 17, OR gate 1702 can include a first e-IGT that has a gate terminal 1714, a source terminal 1716, and a drain terminal 1718, and a second e-IGT that has a gate terminal 1720, a source terminal 1722, and a drain terminal 1724. In some embodiments, input signals (shown as IN 1 and IN 2 in the micrographs shown in FIG. 17) can be applied to gate terminal 1714 of the first e-IGT and to gate terminal 1720 of the second e-IGT, respectively. FIG. 17 shows input voltage signals 1706 and 1708 that can be used as inputs to OR gate 1702 at gate terminal 1714 of the first e-IGT and gate terminal 1720 of the second e-IGT, respectively. FIG. 17 also shows an OR output signal 1710, which can be a drain current (shown as $I_{Dout}$ in the micrograph shown in FIG. 17).

As shown in FIG. 17, AND gate 1704 can include a first e-IGT that has a gate terminal 1726, a source terminal 1728, and a drain terminal 1730, and a second e-IGT that has a gate terminal 1732, a source terminal 1734, and a drain terminal 1736. In some embodiments, input signals (shown as IN1 and IN2 in the micrographs shown in FIG. 17) can be applied to gate terminal 1726 of the first e-IGT and gate terminal 1732 of the second e-IGT respectively. FIG. 17 shows an AND output signal 1712 that can be a drain current (shown as $I_{Dout}$ in the micrograph shown in FIG. 17) that is produced when input voltage signals 1706 and 1708 are applied to gate terminal 1726 of the first e-IGT and to gate terminal 1732 of the second e-IGT, respectively.

Figure 18:
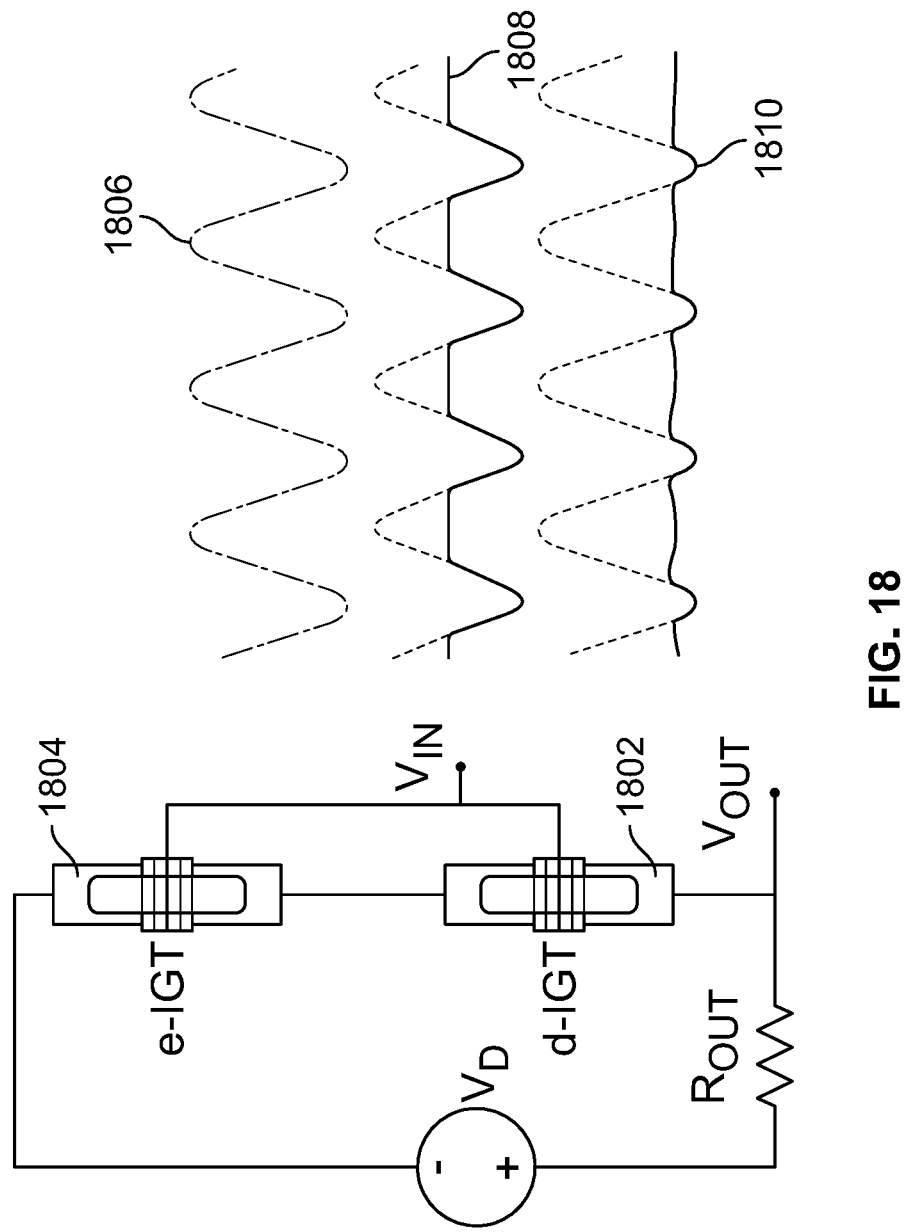
FIG. 18 shows a schematic diagram for combining a d-IGT and an e-IGT to create a non-linear rectification circuit in accordance with some embodiments of the disclosed subject matter.

In some embodiments, a d-IGT and an e-IGT can be combined in the same circuit. For example, as shown in FIG. 18, in some embodiments, a d-IGT and an e-IGT can be combined to create a non-linear rectification circuit, which can be used for any suitable purpose, such as for inclusion in a neurostimulation device to improve a Signal-to-Noise Ratio (SNR) of detected signals. In some embodiments, an input to the circuit, $V_{in}$, can be connected to a gate electrode of a d-IGT 1802 and to a gate electrode of an e-IGT 1804. Therefore, as shown in FIG. 18, $V_{in}$ can correspond to a gate voltage $V_g$ applied to each of d-IGT 1802 and e-IGT 1804.

In some embodiments, when $V_{in} < 0V$, d-IGT 1802 can be doped at its full capacity, and changes in $V_{in}$ at negative voltages do not change a conductance of d-IGT 1802. Therefore, in some embodiments, when $V_{in} < 0V$, d-IGT 1802 can act as a low value resistor with a resistance dependent on a geometry of d-IGT 1802. In some embodiments, when $V_{in} < 0V$, e-IGT 1804 can be in its linear region of operation. Therefore, in some embodiments, when $V_{in} < 0V$, the combination of d-IGT 1802 acting as a resistor and e-IGT operating in its linear region can form a non-inverting amplifier circuit, where the input signal $V_{in}$ will be amplified using the e-IGT-based non-inverting amplifier.

In some embodiments, when $V_{in} \approx 0V$, e-IGT 1804 can be de-doped and can therefore act as a significantly higher-value resistor compared to d-IGT 1802, which can still be in a doped state. Therefore, a voltage drop across d-IGT 1802 (measured across a drain electrode and a source electrode of d-IGT 1802) can be low, and the d-IGT will not be able to function as a transistor. Continuing further, in this state, the circuit shown in FIG. 18 can be approximated as a resistor equal to the resistance of the e-IGT in its de-doped state. Therefore, when $V_{in} \approx 0V$, no amplification occurs, and the output current can be proportional to a resistance of the e-IGT.

In some embodiments, when $V_{in} > 0V$, e-IGT 1804 can be in a de-doped state, and will maintain a high channel resistance. Additionally, when $V_{in} > 0V$, d-IGT 1802 can begin gradually de-doping as $V_{in}$ increases and can have a resistance comparable to a resistance of e-IGT 1804. Therefore, at positive values of $V_{in}$, the sum of resistance of both d-IGT 1802 and e-IGT 1804 in their de-doped state will be the total circuit resistance, and no amplification occurs.

In some embodiments, characteristics of the non-linear rectification circuit shown in FIG. 18 can be changed by varying a geometry of the d-IGT relative to the e-IGT. For example, when an input voltage $V_{in}$ 1806 (e.g., a 1 Hz sine wave, as shown in FIG. 18) is applied to the gate electrodes of d-IGT 1802 and e-IGT 1804, in an instance in which d-IGT 1802 and e-IGT 1804 have equivalent geometry (e.g., the same dimensions, and/or equivalent geometry in any other suitable manner), can result in thresholding at 0V, as shown by output voltage signal 1808 (e.g., measured at Vout, as shown in the circuit diagram of FIG. 18). As another example, in an instance in which d-IGT 1802 is smaller than e-IGT 1804 (e.g., a smaller channel width, a smaller channel length, and/or smaller in any other suitable manner), applying input voltage $V_{in}$ 1806 to the gate electrodes of d-IGT 1802 and e-IGT 1804 can result in thresholding at negative voltages, as shown by output voltage signal 1810 (e.g., measured at Vout, as shown in the circuit diagram of FIG. 18).

In some embodiments, IGTs can be used for any suitable applications. For example, in some embodiments, IGTs can be used for recording electrical signals from a skin surface of a subject. As a more particular example, as described above in connection with FIG. 11A, in some embodiments, IGTs can be used to record EEG signals from a scalp of a subject. As another more particular example, in some embodiments, electrocardiography (ECG) recordings can be performed using IGTs by placing a probe that includes an IGT on the skin over the left anterior chest of a subject. As yet another more particular example, in some embodiments, electromyography (EMG) recordings can be performed using IGTs placed on the skin over any suitable muscle (e.g., a biceps muscle, a triceps muscle, a quadriceps muscle, and/or any other suitable muscle(s)). In some embodiments, a gate electrode of an IGT can be used as a reference electrode, and can be placed on a reference position of the subject (e.g., on a wrist of the subject, and/or any other suitable reference position).

As another example, in some embodiments, IGTs can be used for invasively recording neurophysiological signals, such as action potentials, local field potentials (LFPs), and/or any other suitable neurophysiological signals. As a more particular example, in some embodiments, IGTs can be placed on a cortical surface to record any suitable cortical surface neurophysiological activity. In some such embodiments, any suitable number of IGTs (e.g., one, two, five, ten, and/or any other suitable number) can be fabricated on a conformable substrate of any suitable material that can be placed on the cortical surface. In some embodiments, recordings can be made with IGTs in any suitable configuration. For example, in some embodiments, a resistor can be placed in series with a drain electrode of each IGT to convert a drain current to a voltage, which can be acquired by any suitable acquisition system as a measure of neural activity. As another example, in some embodiments, in an instance in which multiple IGTs are fabricated in an array, each IGT can have a common source. As yet another example, in some embodiments, a gate electrode of each IGT in a fabricated array can be connected to a screw (e.g., a surgical-grade stainless steel screw) inserted in any suitable brain area (e.g., the cerebellum, and/or any other suitable brain area). Note that, in some embodiments, voltages from each e-IGT can be measured with respect to any suitable ground or reference electrode placed at any suitable location (e.g., another brain area, such as the cerebellum, and/or any other suitable area). In some such embodiments, surgical-grade stainless steel screws can be used as ground or reference electrodes.

Figure 11B:
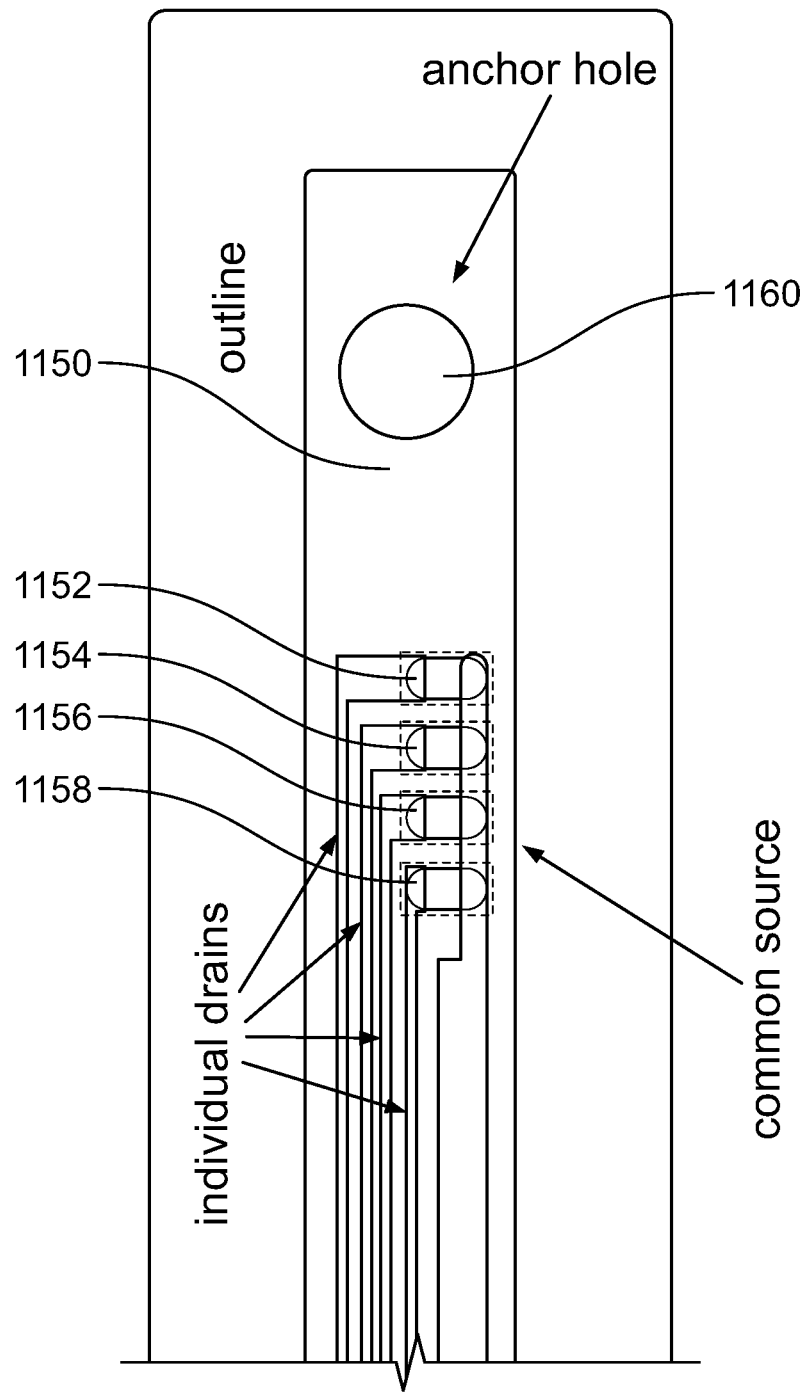
FIG. 11B shows a diagram of a device for measuring cortical activity using IGTs in accordance with some embodiments of the disclosed subject matter.

As another more particular example, neural signals from deep cortical layers can be recorded by inserting one or more IGTs at any suitable cortical location and to any suitable depth (e.g., 1.5 mm, and/or any other suitable depth). Turning to FIG. 11B, an example of a device 1150 that includes e-IGTs to record neurophysiological signals by inserting a probe in a cortical area is shown in accordance with some embodiments of the disclosed subject matter. As illustrated, in some embodiments, any suitable number of e-IGTs (e.g., e-IGTs 1152, 1154, 1156, and 1158, as shown in FIG. 11B) can be fabricated on any suitable conformable substrate (e.g., a conformable parylene-C substrate, and/or any other suitable substrate). In some embodiments, the device can then be inserted in a cortical area in any suitable manner. For example, in some embodiments, the device can be inserted by wrapping the device around any suitable guide wire (e.g., a tungsten microwire, and/or any other suitable guide wire), which can then be used to guide the device during insertion. In some embodiments, a guidewire can be connected to the fabricated e-IGT device via an anchor hole 1160, and when device 1150 reaches a desired cortical depth, the guidewire can be removed from anchor hole 1160, leaving device 1150 at the desired cortical depth and location.

Note that, in some embodiments, the e-IGTs can share a common source. In some embodiments, a gate electrode of the e-IGT can be connected to a screw (e.g., a surgical-grade stainless steel screw, and/or any other suitable screw) implanted in any suitable brain area (e.g., the cerebellum, and/or any other suitable area). In some embodiments, a resistor of any suitable value can be placed in series with each drain electrode to convert a corresponding drain current to a voltage, which can then be measured using any suitable acquisition system as a measure of neural activity. Note that, in some embodiments, voltages from each e-IGT can be measured with respect to any suitable ground or reference electrode placed at any suitable location (e.g., another brain area, such as the cerebellum, and/or any other suitable area). In some such embodiments, surgical-grade stainless steel screws can be used as ground or reference electrodes. Note that placement of IGT probes for invasive neurophysiological recording can be performed in connection with any suitable surgical procedure(s).

In some embodiments, IGTs, whether operating in depletion mode or enhancement mode, can be used to form biomedical sensors or stimulus sources and can be connected to any suitable additional circuits, devices, systems, etc. More particularly, for example, IGTs as described herein can be used to act as sensors for detecting biomedical data that can be captured by a biomedical device, a fitness device, a portable computer, an Internet-of-Things (IoT) device, a smart watch, a smart ring, and/or any other suitable device.

Figure 19:
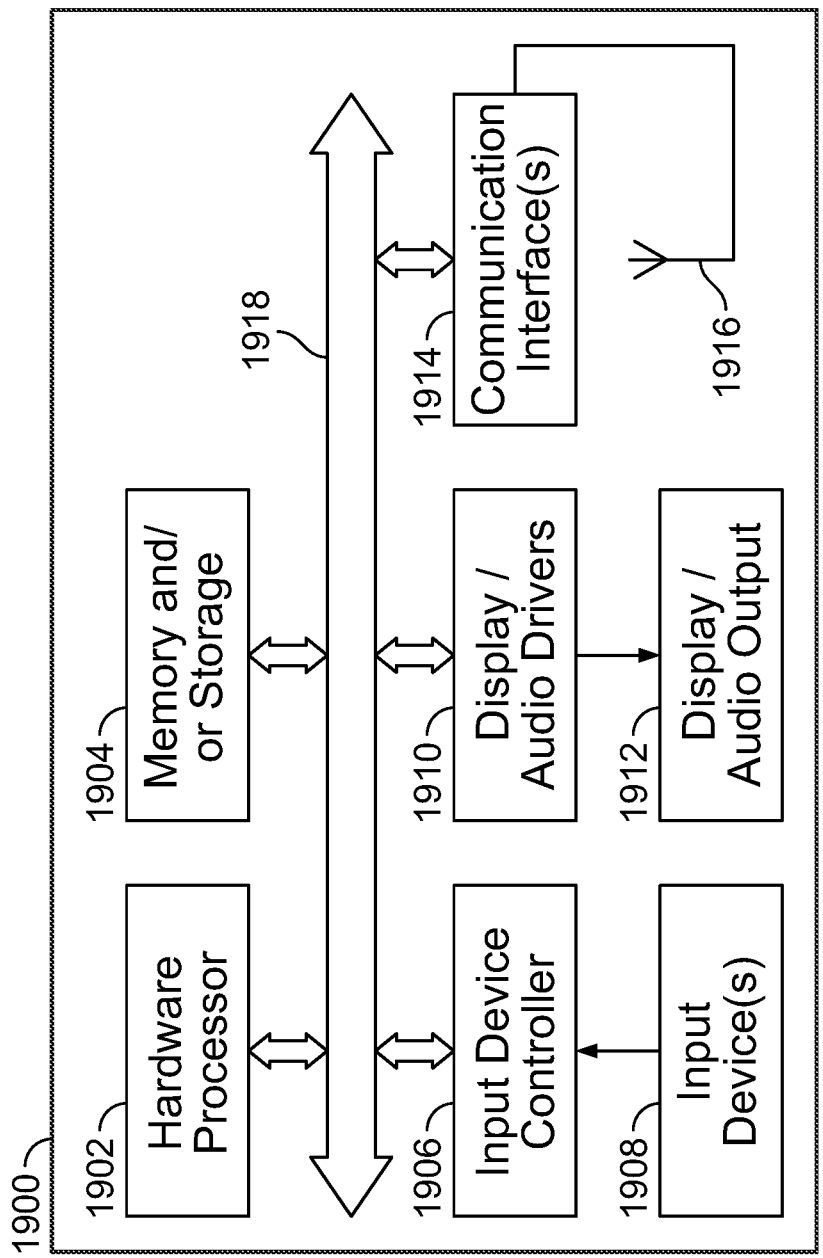
FIG. 19 shows a detailed example of hardware that can be used in a device in accordance with some embodiments of the disclosed subject matter.

Such a biomedical device, a fitness device, a portable computer, an Internet-of-Things (IoT) device, a smart watch, a smart ring, and/or any other suitable device can include and/or be any of a general-purpose device or a special-purpose device. Any such general-purpose device or special-purpose device can include any suitable hardware. For example, as illustrated in example hardware 1900 of FIG. 19, such hardware can include a hardware processor 1902, memory and/or storage 1904, an input device controller 1906, an input device 1908, display/audio drivers 1910, display and/or audio output circuitry 1912, communication interface(s) 1914, an antenna 1916, and a bus 1918.

Hardware processor 1902 can include any suitable hardware processor, such as a microprocessor, a micro-controller, digital signal processor, dedicated logic, and/or any other suitable circuitry for controlling the functioning of a general-purpose computer or special purpose computer in some embodiments.

Memory and/or storage 1904 can be any suitable memory and/or storage for storing programs, data, metrics, and/or any other suitable information in some embodiments. For example, memory and/or storage 1904 can include random access memory, read only memory, flash memory, hard disk storage, optical media, and/or any other suitable storage device.

Input device controller 1906 can be any suitable circuitry for controlling and receiving input from one or more input devices 1908 in some embodiments. For example, input device controller 1906 can be circuitry for receiving input from a touch screen, from one or more buttons, from a voice recognition circuit, from a microphone, from a camera, from an optical sensor, from an accelerometer, from a temperature sensor, from a near field sensor, and/or any other suitable circuitry for receiving user input. In some embodiments, an input device can include an IGT for sensing biomedical conditions of a human. In some embodiments, input device controller 1906 or an input device 1908 can include an analog-to-digital converter for converting analog signals from an IGT, or a sensor or circuit including one or more IGTs, into a digital signal suitable for processing by hardware processor 1902.

Display/audio drivers 1910 can be any suitable circuitry for controlling and driving output to one or more display and/or audio output circuitries 1912 in some embodiments. For example, display/audio drivers 1910 can be circuitry for driving an LCD display, a speaker, an LED, and/or any other display/audio device. In some embodiments, an output device can include an IGT for providing stimulus to a user (e.g., neurostimulation, electrical stimulation on a skin surface of a user, and/or any other suitable stimulus).

Communication interface(s) 1914 can be any suitable circuitry for interfacing with one or more communication networks, such as the Internet or any other suitable network or combination of networks, in some embodiments. For example, interface(s) 1914 can include network interface card circuitry, wireless communication circuitry, and/or any other suitable circuitry for interfacing with one or more communication networks.

Antenna 1916 can be any suitable one or more antennas for wirelessly communicating with a communication network in some embodiments. In some embodiments, antenna 1916 can be omitted when not needed.

Bus 1918 can be any suitable mechanism for communicating between two or more of components 1902, 1904, 1906, 1910, and 1914 in some embodiments.

Any other suitable components can be included in hardware 1900 in accordance with some embodiments.

In some embodiments, any suitable computer readable media can be used for storing instructions for performing the functions and/or processes herein. For example, in some embodiments, computer readable media can be transitory or non-transitory. For example, non-transitory computer readable media can include media such as non-transitory forms of magnetic media (such as hard disks, floppy disks, and/or any other suitable magnetic media), non-transitory forms of optical media (such as compact discs, digital video discs, Blu-ray discs, and/or any other suitable optical media), non-transitory forms of semiconductor media (such as flash memory, electrically programmable read-only memory (EPROM), electrically erasable programmable read-only memory (EEPROM), and/or any other suitable semiconductor media), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Accordingly, internal-ion gated electrochemical transistors are provided.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. An internal-ion gated electrochemical transistor, comprising:
a gate electrode, a source electrode, and a drain electrode;
a channel formed between the source electrode and the drain electrode, wherein the channel comprises a material that includes a conducting polymer and a biocompatible solution, wherein the channel serves as a reservoir of positively charged mobile ions; and
an ion membrane between the channel and the gate electrode, wherein:
in an off state of the internal-ion gated electrochemical transistor, at least a subset of the positively charged mobile ions are ionically bonded to negatively charged ions of the conducting polymer, and wherein in an on state of the internal-ion gated electrochemical transistor, at least a subset of the positively charged mobile ions are unbonded from the negatively charged ions of the conducting polymer to induce a current within the channel, and wherein at least one of the off state and the on state of the internal-ion gated electrochemical transistor is actuated by application of a voltage to the gate electrode.

2. The internal-ion gated electrochemical transistor of claim 1, wherein the on state of the internal-ion gated electrochemical transistor is a state of the internal-ion gated electrochemical transistor when no voltage is applied to the gate electrode.

3. The internal-ion gated electrochemical transistor of claim 1, wherein the off state of the internal-ion gated electrochemical transistor is a state of the internal-ion gated electrochemical transistor when no voltage is applied to the gate electrode.

4. The internal-ion gated electrochemical transistor of claim 1, wherein the conducting polymer is comprised of PEDOT:PSS.

5. The internal-ion gated electrochemical transistor of claim 4, wherein the conducting polymer is further comprised of polyethylenimine (PEI).

6. The internal-ion gated electrochemical transistor of claim 1, wherein the biocompatible solution is comprised of D-sorbitol.

7. The internal-ion gated electrochemical transistor of claim 1, wherein the ion membrane is comprised of chitosan.

8. The internal-ion gated electrochemical transistor of claim 1, wherein a transconductance of the internal-ion gated electrochemical transistor is based on a volume of the channel.

9. The internal-ion gated electrochemical transistor of claim 1, wherein the gate electrode, the source electrode, and the drain electrode are patterned on a conformable substrate.

10. The internal-ion gated electrochemical transistor of claim 9, wherein the conformable substrate comprises parylene.

\* \* \* \* \*